United States Patent [19]

Blades

[11] Patent Number: 5,434,509

[45] Date of Patent: Jul. 18, 1995

[54] METHOD AND APPARATUS FOR DETECTING ARCING IN ALTERNATING-CURRENT POWER SYSTEMS BY MONITORING HIGH-FREQUENCY NOISE

[76] Inventor: Frederick K. Blades, 2450 Four Mile Canyon, Boulder, Colo. 80302

[21] Appl. No.: 316,169

[22] Filed: Sep. 6, 1994

Related U.S. Application Data

[63] Continuation of Ser. No. 100,632, Jul. 30, 1993, abandoned, which is a continuation-in-part of Ser. No. 35,231, Mar. 22, 1993, abandoned, which is a continuation-in-part of Ser. No. 921,829, Jul. 30, 1992, Pat. No. 5,223,795.

[51] Int. Cl.6 ...................... G01R 31/32; H01H 33/26
[52] U.S. Cl. .................................... 324/536; 324/520; 324/613; 361/113
[58] Field of Search ................ 324/520, 521, 522, 525, 324/536, 613, 650; 361/111, 113; 340/650, 658

[56] References Cited

U.S. PATENT DOCUMENTS

| | | |
|---|---|---|
| H536 | 10/1988 | Strickland et al. |
| Re. 30,678 | 7/1981 | Van Zeeland et al. |
| 2,808,566 | 10/1957 | Douma . |
| 3,471,784 | 10/1969 | Arndt et al. |
| 3,588,611 | 6/1971 | Lambden et al. |
| 3,622,872 | 11/1971 | Boaz . |
| 3,626,282 | 12/1971 | Brewer ........................... 324/536 X |
| 3,746,930 | 7/1973 | Van Best et al. ............... 324/536 X |
| 3,764,853 | 10/1973 | Beachley, Jr. |
| 3,775,675 | 11/1973 | Freeze et al. |
| 3,852,734 | 12/1974 | Truax . |
| 3,855,443 | 12/1974 | Bell, Jr. et al. |
| 3,858,130 | 12/1974 | Misencik . |
| 3,869,665 | 3/1975 | Kenmochi et al. |
| 3,878,460 | 4/1975 | Nimmersjo . |
| 3,882,287 | 5/1975 | Simmonds . |
| 3,904,839 | 9/1975 | Peoples . |
| 3,911,323 | 10/1975 | Wilson et al. |
| 3,914,667 | 10/1975 | Waldron . |
| 3,999,103 | 12/1976 | Misencik et al. |
| 4,047,235 | 9/1977 | Davis . |
| 4,063,168 | 12/1977 | Franke . |
| 4,079,434 | 3/1978 | Elmore . |
| 4,081,852 | 3/1978 | Coley et al. |
| 4,100,487 | 7/1978 | Wojtasinski et al. |
| 4,115,828 | 9/1978 | Rowe et al. |
| 4,159,501 | 6/1979 | White . |
| 4,169,260 | 9/1979 | Bayer . |
| 4,191,921 | 3/1980 | Yoshino . |
| 4,208,627 | 6/1980 | Ebert, Jr. |
| 4,214,210 | 7/1980 | O'Shea . |
| 4,229,626 | 10/1980 | Peoples . |
| 4,245,187 | 1/1981 | Wagner et al. |
| 4,316,187 | 2/1982 | Spencer . |
| 4,347,541 | 8/1982 | Chen et al. |
| 4,376,243 | 3/1983 | Renn et al. |
| 4,387,336 | 6/1983 | Joy et al. |
| 4,402,030 | 8/1983 | Moser et al. |

(List continued on next page.)

FOREIGN PATENT DOCUMENTS

0901947  4/1975  U.S.S.R.

OTHER PUBLICATIONS

"Detection of Arcing . . . " Electric Power Research Inst. EPRI EL–2757, 12/82.
"Direction Coupler . . . " Alejandro Duenas J., RF Design, 02/86, pp. 62–64.
"Direction Couplers" Antonio Paolantonio, RF Design, Sep./Oct. '79 pp. 40–49.

Primary Examiner—Kenneth A. Wieder
Assistant Examiner—Diep Do
Attorney, Agent, or Firm—Michael de Angeli

[57] ABSTRACT

An arc detector for detecting potentially hazardous arcing in electrical connections comprises detection and signal processing circuitry for monitoring high-frequency noise characteristic of arcing on the power line and distinguishable from other sources of high-frequency noise.

24 Claims, 11 Drawing Sheets

U.S. PATENT DOCUMENTS

| | | |
|---|---|---|
| 4,447,845 | 5/1984 | Wilkinson . |
| 4,466,071 | 8/1984 | Russell, Jr. . |
| 4,532,568 | 7/1985 | Kraus, Sr. . |
| 4,536,815 | 8/1985 | Li et al. . |
| 4,542,468 | 9/1985 | Taniquti . |
| 4,617,636 | 10/1986 | Johns et al. . |
| 4,630,228 | 12/1986 | Tarczy-Hornoch et al. . |
| 4,639,817 | 1/1987 | Cooper et al. . |
| 4,644,439 | 2/1987 | Taarning . |
| 4,658,322 | 4/1987 | Rivera . |
| 4,658,323 | 4/1987 | Dougherty . |
| 4,670,812 | 6/1987 | Doerfler et al. . |
| 4,697,218 | 9/1987 | Nicolas . |
| 4,706,156 | 11/1987 | Caunce . |
| 4,771,355 | 9/1988 | Emery et al. . |
| 4,775,839 | 10/1988 | Kosina et al. . |
| 4,810,954 | 3/1989 | Fam . |
| 4,826,228 | 4/1989 | Bittner . |
| 4,851,782 | 7/1989 | Jeerings et al. . |
| 4,853,818 | 8/1989 | Emery et al. . |
| 4,858,054 | 8/1989 | Franklin . |
| 4,897,607 | 1/1990 | Grünewald et al. . |
| 4,922,368 | 5/1990 | Johns . |
| 4,931,894 | 6/1990 | Legatti . |
| 4,949,214 | 8/1990 | Spencer . |
| 4,951,170 | 8/1990 | Fromm . |
| 5,038,246 | 8/1991 | Durivage, III . |
| 5,047,724 | 9/1991 | Boksiner et al. . |
| 5,185,684 | 2/1993 | Beihoff et al. . |
| 5,185,685 | 2/1993 | Tennies et al. . |
| 5,185,686 | 2/1993 | Hansen et al. . |
| 5,185,687 | 2/1993 | Beihoff et al. . |
| 5,206,596 | 4/1993 | Beihoff et al. . |
| 5,208,542 | 5/1993 | Tennies et al. . |
| 5,224,006 | 6/1993 | MacKenzie et al. . |
| 5,280,404 | 1/1994 | Ragsdale . |
| 5,307,230 | 4/1994 | MacKenzie . |
| 5,359,293 | 10/1994 | Boksiner et al. . |

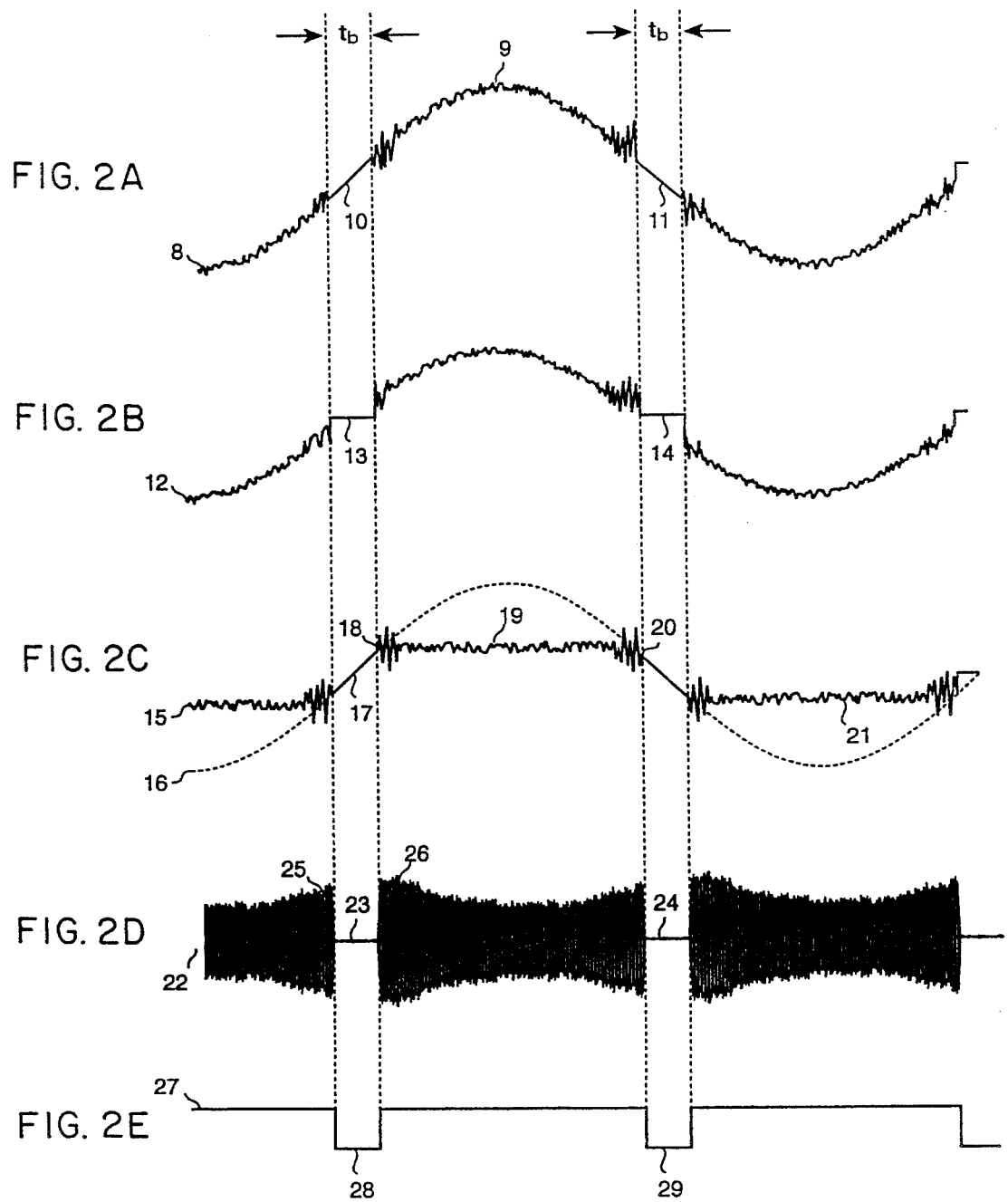

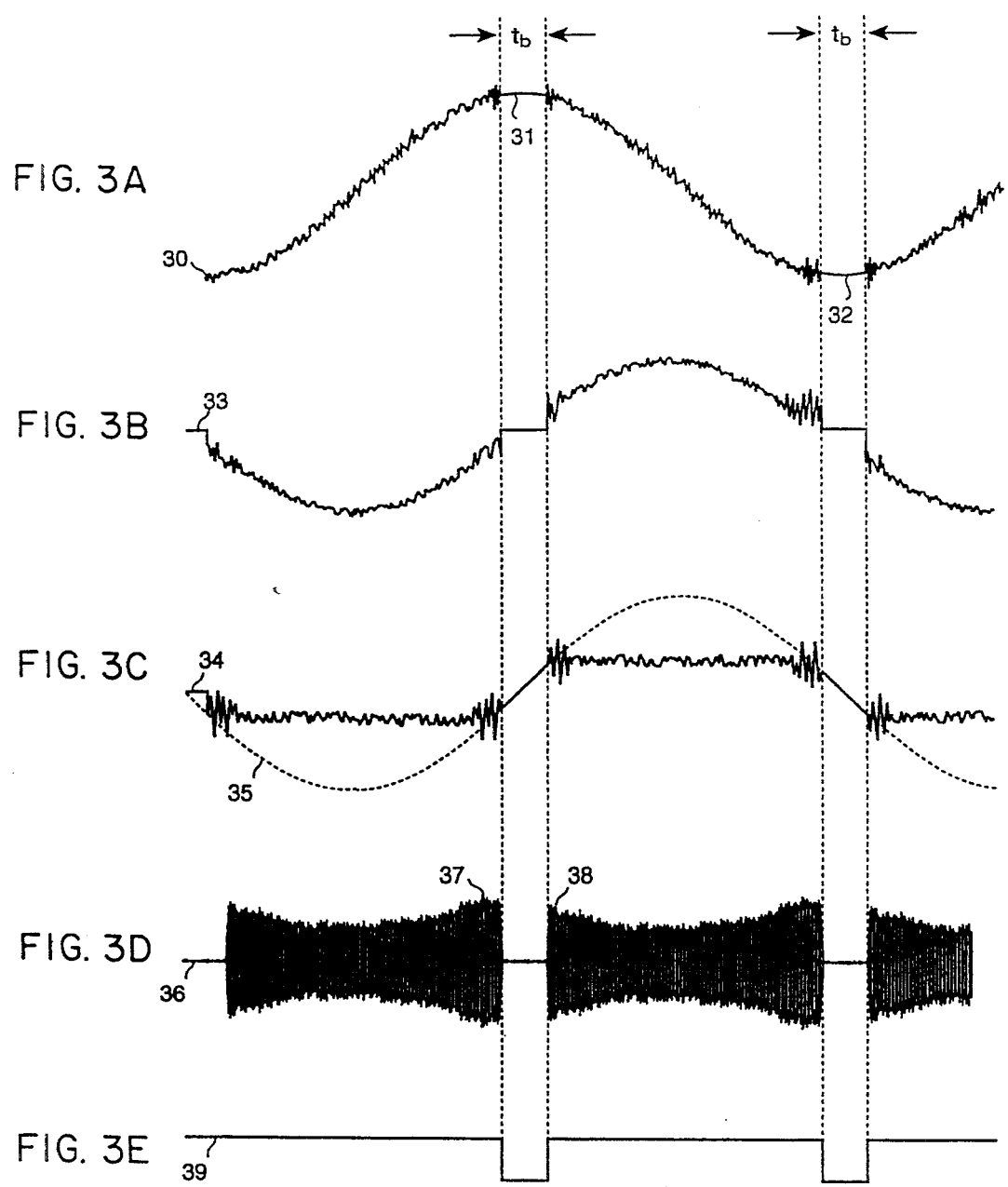

LEGEND

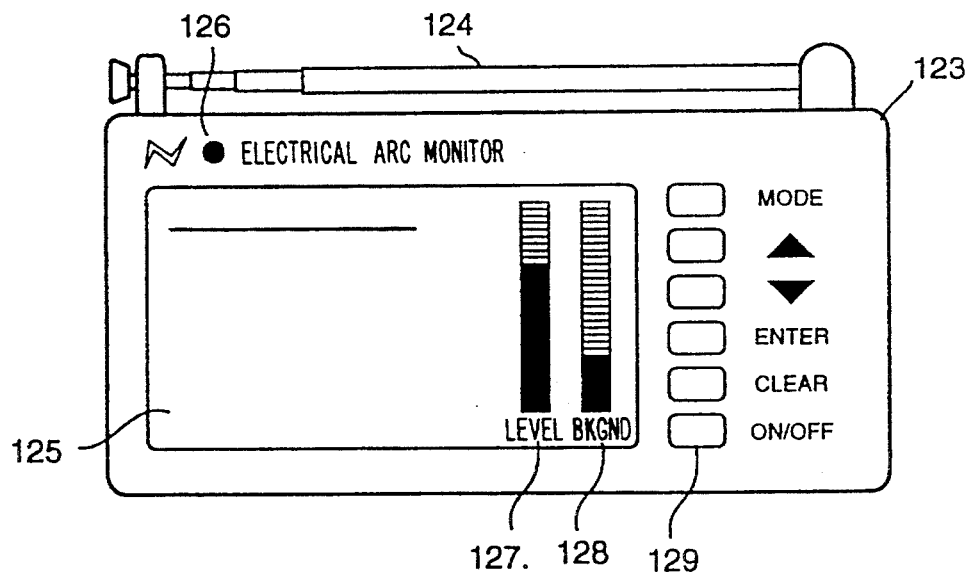
FIG. 11
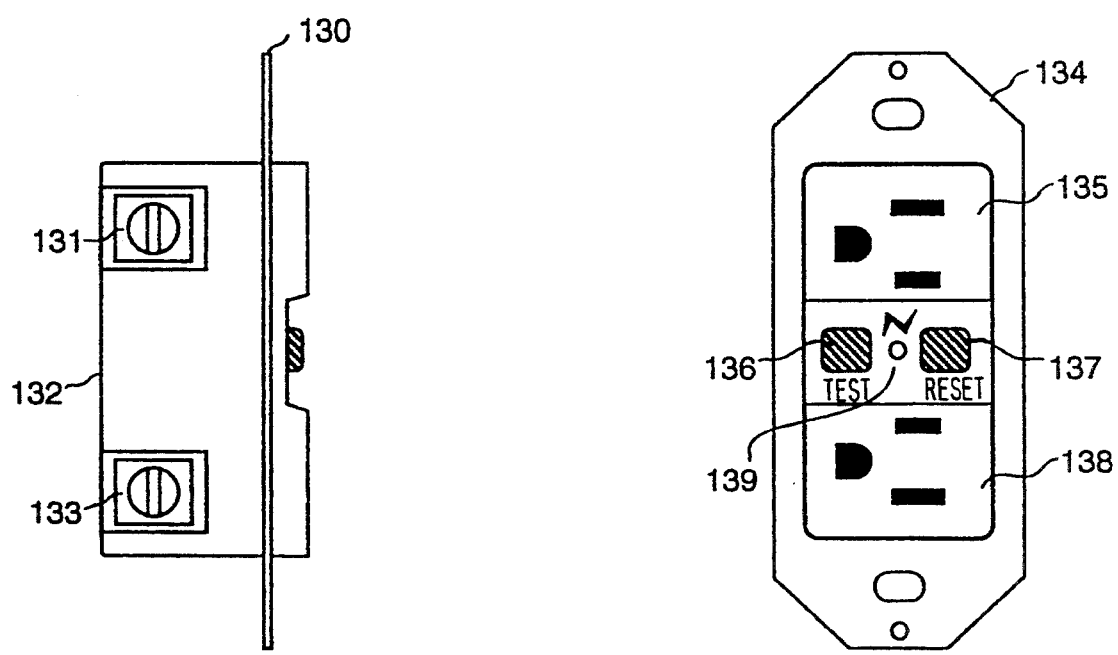
FIG. 12A                    FIG. 12B

METHOD AND APPARATUS FOR DETECTING ARCING IN ALTERNATING-CURRENT POWER SYSTEMS BY MONITORING HIGH-FREQUENCY NOISE

CROSS REFERENCE TO RELATED APPLICATIONS

This application is a continuation of application Ser. No. 08/100,632, filed Jul. 30, 1993, now abandoned, which is a continuation-in-part of Ser. No. 08/035,231, filed Mar. 22, 1993, now abandoned, which is a continuation-in-part of Ser. No. 07/921,829, filed Jul. 30, 1992, now U.S. Pat. No. 5,223,795.

BACKGROUND OF THE INVENTION

1. Field of the Invention

This invention relates to an inexpensive detector of electrical arcs on power lines, for providing advance warning of potentially dangerous conditions.

2. Discussion of the Prior Art

Electrical arcs can develop temperatures well above the ignition level of most common flammable materials, and therefore pose a significant fire hazard. For example, worn power cords in the home may arc sufficiently to start a fire. Fortunately, arcing is an inherently unstable phenomena and does not usually persist long enough to start a fire. Under certain conditions, reflected in particular characteristics of the electrical disturbance produced, the likelihood of the arc persisting and starting a fire is much higher. It is one object of the present invention to provide a method and apparatus to detect such potentially dangerous arcs by monitoring voltage disturbances on the power lines.

Two basic types of arcing are likely to occur in the home: line fault arcing and contact arcing. An arc due to a line fault results from either a line-to-line short or a line-to-ground short. When a fault of this type occurs several things are likely to happen: 1) the fault will draw current up to or beyond the capacity of the circuit; 2) lights will dim indicating an excessive load is being drawn; and 3) if the circuit is properly protected by a circuit breaker, the breaker will trip, interrupting supply of power to the arc. All of this will likely occur and be completed in less than a second. The resulting arcing will be explosive but short-lived, reducing the total heat to be dissipated by surrounding materials and thus reducing the likelihood of a fire.

Contact arcing results from a high resistance connection in series with a load. This may occur due to loose connections, oxidized contacts, or foreign non-conducting material interfering with the conduction path.

One example of a condition that may cause contact arcing is a well-used wall outlet wherein the spring pressure provided by the contacts has been reduced through age and use, so that insufficient pressure is applied to the inserted plug contacts to ensure low-resistance connection.

Contact arcing is also commonly caused by use of extension cords of insufficient current-carrying capacity. For example, the plug may be heated by resistance heating, gradually decomposing elastomeric insulating material around the contacts until the material partially flows into the contact area, preventing proper contact from being made. This process may become regenerative as the initial arcing produces more heat, carbonizing the insulation, producing a hard insulative layer on the contact surface.

A third cause of contact arcing often observed in aluminum wiring involves the oxidation of contacts. In this case a chemical 6 process, principally oxidation, builds up a semi-conductive or non-conductive layer on the surface of the contacts. Preferably, when the material of the conductors is susceptible to oxidation, the contacts are gas-tight, preventing oxygen from entering and promoting oxidation. However, if the connections become loose over time, oxidation begins and arcing can result.

Many instances of contact arcing result from the gradual degeneration of the current-carrying contacts. Dangerous arcs may begin as small occasional arcing, gradually building up over time until the arcing become persistent enough to start a fire. For this reason, it would be highly advantageous if contact arcing conditions could be detected early, and a warning provided before the fault reaches a dangerous level.

It will thus be appreciated that there are fundamental differences between line fault arcing and contact arcing. The former will generally involve high currents ($>20$ A), be somewhat explosive and either burn itself out or trip a circuit breaker. Conventional circuit protection devices are normally adequate to guard against line fault arcing. By comparison, the average current drawn in contact arcing is no more than the current drawn by the load itself. Nevertheless, even low-current contact arcing, for example, a 60 watt light bulb on the end of a faulty extension cord, or a set of Christmas tree lights with faulty contacts, may release sufficient heat to cause a fire. Accordingly, conventional circuit breakers are inadequate to prevent dangerous conditions due to contact arcing.

A need therefore exists for an inexpensive plug-in monitoring device capable of detecting arcing that may result in a fire. The most convenient device would be a small 'night-light' style plug-in module capable of monitoring an entire house and providing a warning if potentially dangerous arcing occurs. The detection, in this case, must be made by monitoring voltage alone; to monitor current would require a current sensor to be placed around a conductor, thereby requiring the device to be wired in place. Ideally, such an arc detector would be the electrical arc equivalent to the smoke detectors widely in use today, with the further advantage of warning of a potential fire days, weeks or even months in advance of its occurrence.

When the arc detector as above senses that potentially dangerous arcing is present, the homeowner should be alerted to have an electrician check the wiring to determine the cause of the arcing. A hand-held, battery-powered diagnostic device for use by an electrician in locating the origin of the arcing and correcting the fault would be highly useful. Such a device might sense electrical arcing by monitoring radio-frequency emissions from the power line due to arcing and as such would require no direct connection. If the source of the arcing was not immediately apparent, the electrician could place this device near suspect areas and leave it for a period of time. If arcing occurred again, the diagnostic device would record parameters of the arcing such as the number of occurrences, the time of occurrence, the direction of maximum intensity, the duration, etc., to assist in locating the source of the arcing.

A need also exists for a circuit breaker that in addition to detecting arcing that may result in a fire removes power from the load in the event that it detects sufficient arcing to present a hazard. Such a device could be conveniently packaged in much the same style as a conventional circuit breaker, or could be installed in an outlet similar to the currently available ground fault interrupters. Because the load current flows through the circuit breaker, it is convenient in this application to monitor load current.

The arc detector in each embodiment must be immune to noise commonly present on household power lines, e.g., due to lamp dimmers, motors, carrier-current communications systems, switching transients, and the like.

While there have been a number of devices proposed to detect arcing, most address arcs caused by line faults. U.S. Pat. No. 5,121,282 issued to White, for example, describes a system that monitors both line voltage and current for characteristics particular to arcing and trips a circuit breaker if enough of these characteristics are present. The White device assumes, however, that the arc is the result of a line fault. One characteristic of a line fault is that the fault current will lag the voltage by 70°–90°. This is because under line fault conditions, the current flow will depend almost entirely on the power distribution wiring which is generally highly inductive. A plug feeding a heater that is arcing in the socket—that is, exhibiting a contact fault—will not exhibit this characteristic and thus the fault will not be detected by the White device.

U.S. Pat. No. 4,639,817 to Cooper et al shows an arc detector for "grid" or "spot" type power networks as used in large commercial or industrial installations. The Cooper circuit interrupts the power if high-frequency (10 KHz–100 KHz) noise of more than a threshold amplitude is detected for more than 0.7 seconds. If adapted to home use, this detector would be tripped by continuous high-frequency noise, such as from electric drills and the like.

U.S. Pat. No. 4,858,054 to Franklin recognizes that arc short circuits differ from dead short circuits, as described above, and indicates that different detection techniques should be employed. However, Franklin's device still monitors the current and trips only when current in excess of a predetermined level is detected. This level of current must be much higher than the circuit's rated current, to avoid tripping on motor start-up currents and the like. Accordingly, Franklin's device can only detect arcs in short circuits, and cannot detect a contact arc in series with a current-limiting load.

Also of general interest are U.S. Pat. Nos. 5,038,246 to Durivage, 4,951,170 to Fromm, and 4,402,030 to Moser et al.

One device currently available is the Ground Fault Interrupter or GFI. Typical GFI devices are capable of detecting leakage currents to ground as low as several milliamps, and trip an associated circuit breaker in response. A GFI very effectively reduces not only the danger of fire due to shorts to ground but also protects humans that may be in the electrical path. A GFI device is not however capable of monitoring contact arcing as discussed herein.

OBJECTS OF THE INVENTION

It is therefore an object of the present invention to provide a method for monitoring line voltage, load current, or energy radiated from the power conductors, whereby persistent arcing that may potentially cause a fire may be detected, while noise on the power line from other sources, such as electric motors, switch closures, lamp dimmers, or communication systems is rejected.

It is a further object of the present invention to provide specific additional and/or alternative methods of arc detection for use in specific circumstances that demand particular performance criteria.

It is a further object of the present invention to provide an inexpensive, plug-in device that monitors noise on the power line due to arcing, to reliably detect dangerous arcing and to warn the user with both visual and audible alarm indications.

It is a further object of the present invention to provide a battery-powered arcing diagnostic device that can detect potentially hazardous arcing, without any direct connection to the power wiring, by receiving radio-frequency emissions from such arcing, and which records and displays various parameters of the arcing to assist in diagnosing the source of the arcing.

It is yet a further object of the present invention to provide an apparatus capable of detecting potentially hazardous arcing on a particular circuit, and which trips a circuit breaker in response to such detection, interrupting current to that circuit.

SUMMARY OF THE INVENTION

The arc detector of the present invention monitors either the line voltage, the line current, or energy radiated from the power line for the presence of high-frequency noise exhibiting certain distinctive patterns which have been discovered by the inventor to be characteristic of contact arcing, and in this manner produces an output responsive to the presence of contact arcing. This output may be used to activate an alarm or to interrupt current to the arc.

Electrical arcing produced by alternating voltage will extinguish each time the voltage across the arc drops below a value sufficient to sustain the arc, and will re-ignite each time the voltage across the arc exceeds the arc's ignition voltage. Therefore, arcs sustained by an alternating power source will necessarily extinguish at least twice every full cycle of the power source frequency. The period of time when the arc is not conducting is hereinafter referred to as the 'gap'. It has been observed by the present inventor that when this gap is very large (20°–90° of the 360° line cycle), the arc will be intermittent and highly unstable, often self-extinguishing after a short period of time. It has also been observed that as this gap becomes smaller (1°–20°), the arc becomes more persistent and under certain conditions may become self-sustaining. Once the arcing becomes self-sustaining, it may persist for minutes or longer and is capable of generating significant amounts of heat.

During the time the arc is conducting current, it produces wideband, high-frequency noise ranging from about 10 KHz to perhaps 1 GHz. During the time the arc is not conducting current, i.e., during the gaps, it produces no noise. The present inventor has realized that the resulting characteristic pattern of high-frequency noise with synchronous gaps is unique to arcing and that therefore an algorithm for analyzing repetitive patterns in the noise can be used to detect arcing. This basic principle is common to both the embodiments of the invention disclosed in the "grandparent application" now issued as U.S. Pat. No. 5,223,795 and to those disclosed in application Ser. No. 08/035,231, the parent of the present continuation-in-part application.

In the embodiments of the invention disclosed in the grandparent application, now U.S. Pat. No. 5,223,795, the preferred frequency band (i.e., the band of frequencies within which noise was monitored to detect arcing) was selected to be 100 KHz to 1 MHz, because signals in this bandwidth traverse household wiring with relatively low attenuation. There are a variety of common household devices that produce considerable amounts of extraneous noise in this frequency range, and consequently the detection algorithms were optimized to reject such interference.

Since the filing of the grandparent application, the inventor has continued to research the physical mechanisms of contact arcing, and has developed and tested several more prototypes. During this time he has realized improvements to the arc detection circuits and the arc detection algorithms, particularly with respect to use of a higher frequency band for detection of contact arcing. In the embodiments of the invention disclosed in the parent of the present continuation-in-part application, Ser. No. 08/035,231, the preferred frequency band is 1 MHz to 10 MHz, wherein the nature of the interference from extraneous noise sources is somewhat different. Therefore, the detection algorithms disclosed in application Ser. No. 08/035,231, while substantially similar to those discussed in the parent application, were optimized to better address this new frequency band. It should be recognized, however, that operation in these and other frequency ranges offer relative advantages in varying applications and that both the methods and apparatus disclosed in the parent and grandparent applications as well as those first disclosed herein may be useful in substantially any frequency range, depending on various factors.

As mentioned above, the nature of the noise from extraneous sources in the frequency range from 1 MHz to 10 MHz differs from the extraneous noise present in lower frequency ranges. Consequently, the detection algorithms must address different constraints. In fact, while the attenuation may be slightly higher, there are several advantages to operating in the 1-10 MHz range for arc detection in household applications.

First, extraneous noise in this higher frequency range produced by such household devices as lamp dimmers and the like tends to be very short lived in this higher frequency range, occurring only at current switching transitions and decaying very rapidly. Second, synchronous line noise from extraneous sources is minimal; because noise present in this frequency range will interfere with radio broadcasts, household appliances and other equipment are intentionally designed to minimize such noise. For example, devices that provide remote control of appliances and the like by using carrier-current transmission in the range of 100-300 KHz (and which signals must be rejected by the preferred embodiment disclosed in the grandparent application) are tuned to produce almost no noise in the higher frequency range of the preferred embodiment of the invention disclosed herein. In fact, the most prevalent source of extraneous noise in the 1-10 MHz bandwidth is AM and communications-band radio transmission; since such signals bear no temporal relationship to the line frequency, they are easily rejected according to the invention. Third, the relative lack of synchronous high-frequency noise in this higher bandwidth allows an improved detection algorithm to reliably detect arcing that, while substantially persistent, does not necessarily produce the ideal pattern of continuous arcing between the two expected gaps per line cycle as discussed in the grandparent application. Finally, signals in this frequency range are high enough to traverse the interwinding capacitance of transformers, and thereby allow detection of arcing across the phases of household wiring and within transformer-powered equipment. Accordingly, the first step of the method of the invention is to filter and amplify one of the line voltage or the load current, so as to extract high-frequency noise in a desired frequency range.

Noise originating from arcing and thus extracted will exhibit certain characteristics. First, the high-frequency noise will be present on both the line voltage and the load current whenever the arc is conducting. Second, the amplitude of the high-frequency noise will go essentially to zero as the arc extinguishes and re-ignites. This will occur each time the voltage across the arc goes through zero, i.e., every half-cycle of the line frequency, and therefore synchronous gaps in the high-frequency noise will be produced. If the load is resistive, the voltage across the arc will be in phase with the line voltage and consequently these gaps will coincide with the line voltage zero-crossings. If the load is reactive, the voltage across the arc (and therefore the gap) may be shifted in phase relative to the line voltage by up to plus or minus 90°. Therefore, depending on the reactance of the load in series with the arc, the gaps may or may not occur at the line voltage zero-crossings. In all cases when the arc is conducting, however, there will be gaps in this noise at intervals equal in time to ½ the line frequency cycle.

Contact arcing becomes dangerous only when the arcing persists long enough to transfer substantial heat to flammable materials in the immediate vicinity of the arc and thereby ignite a fire. The amount of time required for this to happen is a function of both the power dissipated in the arc and the thermal resistance and heat capacity of the surrounding materials. Therefore, in order to detect contact arcing that may be dangerous, it is desirable, once the high-frequency noise is identified as being characteristic of arcing, to require that the arcing substantially persist for a period of time, typically 1 second or more, before concluding that hazardous arcing exists.

One further consideration is that if the load is half-wave rectified, the load current will flow only on like-polarity half-cycles of the line voltage and consequently the arc will conduct only during these same half-cycles. In this case, the characteristic pattern of high-frequency noise followed by a gap will be exhibited only during alternate half-cycles of the line voltage.

It was accordingly the general method of the invention disclosed in Ser. No. 08/035,231 to monitor the line voltage, line current, or energy radiated from the power line, for the presence of synchronous gaps in the high-frequency noise. If continuous monitoring reveals that the gaps occur in a manner indicative of the presence of arcing, for example, if synchronous gaps are detected in a given fraction of a half-cycles of the power frequency over a time interval of predetermined length, potentially dangerous arcing is determined to exist. An output indicating the same may then be actuated, or another appropriate control action taken.

The term "synchronous gaps" in the context of this invention means that the time between gaps is an integral multiple of T/2, where T is the period of the line voltage.

The preferred embodiment of the present invention uses real-time software and a low-cost microprocessor to detect contact arcing. This approach has the advantage that the detection algorithms can be readily optimized by modifying the detection software. However, other methods that produce the same result can be used, for example, to reduce the costs of the unit. A purely analog circuit, implementing conventional integration, threshold detection and missing pulse techniques might be produced on a single chip for the lowest product cost. Alternatively, a digital signal processing (DSP) chip using conventional cross-correlation or auto-correlation analysis might be employed, at somewhat higher product cost, to detect arcing in more stringent applications.

Regardless of the signal processing technique chosen, the basic detection method of the invention of the parent and grandparent applications is to determine whether certain predetermined patterns of gaps characteristic of arcing occur in the high-frequency noise synchronized to the power waveform, and if so whether these patterns are persistent enough to indicate dangerous arcing.

More specifically, in one preferred embodiment, gap monitoring is performed by attempting to detect certain specific 'features' of the gap, such as the leading edge, the trailing edge, or the width of the gap, and then measuring the time intervals between successive occurrences of the detected feature. The relative advantages and disadvantages of detecting each of these three features are discussed in detail below. If the selected feature is found to repeat at least a minimum number of times spaced by intervals equal to T, where T is the period of the line voltage, a pattern indicative of arcing is determined to exist. If this pattern persists long enough, and with few enough interruptions, dangerous arcing is determined to be present, and a output signal indicating the same is provided.

An apparatus according to the invention of the parent application Ser. No. 08/035,231 and performing the method described above using any of the three gap identifying Features is described in detail below. The device according to the invention for monitoring line voltage alone may be configured as a self-contained, plug-in 'night-light', providing both visual and audible indications of the presence of contact arcing. In this preferred embodiment, the arc detector of the invention may be housed in a small, plastic enclosure with a standard, two-prong plug on the back and a large illuminated switch on the front. The light in the switch is labeled "Check Electrical Wiring". Whenever arcing is detected, if the arcing is persistent enough to present a hazard, the light will turn on and remain on continuously and the device will beep every 3 seconds until the illuminated switch is pressed to reset the device. If not manually reset, the device will turn the light back off and re-arm itself after 24 hours. Normally the detector will remain inactive. If the detector trips an imminent danger exists and the homeowner should call an electrician to check the house wiring.

In another embodiment of apparatus according to the invention of the parent application, a circuit monitoring load current is combined with an electrically actuated circuit breaker to provide automatic shutoff of power when a sufficient amount of contact arcing has been detected to indicate a potential fire hazard. In this case, a small LED is provided to indicate the presence of arcing before enough arcing has been detected to trip the breaker. It also serves to indicate, by remaining illuminated, that the breaker tripped due to arcing and not overcurrent. Two preferred embodiments are shown; one where the device is built into a dual wall outlet in much the same style as known ground fault interrupters, and another where the device is built into a circuit breaker for installation into a distribution panel.

In a further embodiment, the detection circuitry is wirelessly coupled to the power line, for convenient diagnostic use, and suitable analytic outputs are provided.

The Present Second Continuation-in-part Application

As indicated above, this application is a continuation-in-part of Ser. No. 08/035,231, which was itself a continuation-in-part of a prior application, now issued as U.S. Pat. No. 5,223,095. As the text just preceding this paragraph describes, the methods of arc detection disclosed and claimed in those prior applications in effect look for gaps synchronized to the line frequency in high-frequency noise due to arcing. In essence, the gap detection methods of the two prior applications require that the arc be substantially continuous, that is, that high-frequency noise be present during much of the waveform, apart from gaps around the zero-crossings of the current waveform. In most circumstances this detection method will be entirely adequate to protect against fires, because under most circumstances the amount of heat required to ignite a fire would require that a continuous arc be present. Accordingly, the arc detectors in the prior application and issued patent are capable of preventing most fires, since they are capable of detecting substantially continuous arcing.

However, there are circumstances wherein it would be desirable to detect arcing even before it reaches the substantially continuous level required to be detected according to the methods of the parent applications. The invention disclosed and claimed in the present continuation-in-part application describes further understanding of the arcing phenomenon, particularly at the inception of arcing. This new knowledge can be used, in turn, to derive more sophisticated arc detection algorithms which are capable of detecting arcing long before it becomes even substantially continuous.

According to this present understanding, it is realized that the methods of arc detection described in the parent application and the issued patent are functional because the gaps are well-defined; that is, the gaps in the noise due to arcing have sharp edges. These sharp edges—that is, the very abrupt rise and fall in the current or voltage noise waveforms at the beginning and ending of arcing—are the result of the physics which control arcing, as follows.

Arcing begins when the voltage across a gap filled with air or another ionizable substance is sufficient to impel an electron to escape from its atom, thus ionizing the atom. That electron, under the influence of the electric field between spaced electrodes exhibiting a potential difference, will move from the negative electrode toward the positive electrode, and will strike another atom, knocking off another electron. These two electrons then are accelerated and strike more atoms, releasing more electrons, and so on. The phenomenon of the exponential growth in the number of free electrons in the gap is referred to as electron "avalanche breakdown." This phenomenon is employed in numerous semiconductor devices that require fast switching, as is discussed in detail below.

In effect, this further understanding allows the inventor to provide an arc detector which detects further specific patterns in the high-frequency noise unique to arcing. The detection circuitry provided according to this improved embodiment of the invention monitors the noise on the powerline in order to detect bursts of high-frequency noise, each having sharply-defined rise and fall times. Such bursts may be detected by differentiating the noise signal; equivalently, bursts may be detected by identifying a very high-frequency signal, e.g., greater than 10 MHz and possibly up to 100 MHz. If it is desired to detect arcing by looking for bursts of noise, typically a minimum burst width will be established to distinguish noise due to arcing from extraneous pulses from other sources. Further, the widths of the bursts and their spacing may be examined to determine whether they are substantially nonuniform, in order that high-frequency noise due to arcing can be distinguished from avalanche breakdown in semiconductor devices used in lamp dimmers and the like; these devices emit bursts which are consistent in length and are synchronized to the line frequency. The precise time of occurrence of the bursts may also be compared to the zero-crossings of the current waveform, as at those points there is insufficient energy available to initiate the arc.

BRIEF DESCRIPTION OF THE DRAWINGS

The invention will be better understood if reference is made to the accompanying drawings, wherein:

FIGS. 2(a)–2(e) show characteristic waveforms associated with a resistive load that is arcing at one contact as a function of time.

FIGS. 3(a)–3(e) show characteristic waveforms associated with an inductive load that is arcing at one contact as a function of time.

FIG. 11 is a front elevational view of a physical package for the circuit of FIG. 8.

FIGS. 12(a) and 12(b) are front and side elevational views respectively of a physical package for the circuit of FIG. 9.

DESCRIPTION OF THE PREFERRED EMBODIMENTS

Figure 1:
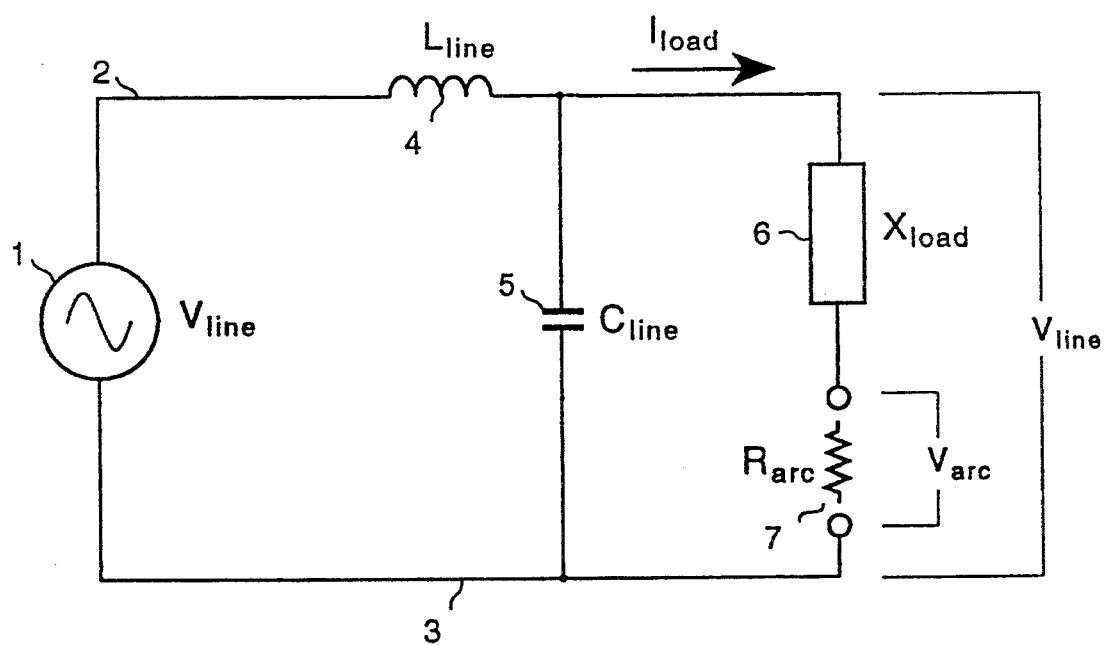
FIG. 1 shows the equivalent circuit diagram of a contact arc.

FIG. 1 shows a simplified equivalent circuit diagram of a contact arc. The line voltage 1 provides a "high" side 2 and neutral 3 conductors. All line and arc voltages referred to herein are conveniently measured relative to this neutral 3. Typical house wiring, i.e., flat three-conductor cable with the center conductor ground, acts as a transmission line with a characteristic impedance of about 100Ω. An inductance 4, indicated as $L_{line}$, and a capacitance 5, indicated as $C_{line}$, represent the lumped inductance and capacitance, respectively, of the power distribution lines. The load 6 is connected in series with a gap 7 across which the contact arc current passes when the arc is formed. When the arc is conducting current, the gap 7 has an effective resistance indicated as $R_{arc}$ in FIG. 1. The impedance of the load 6, indicated as $X_{load}$, can be resistive, capacitive or inductive depending on the type of load. Incandescent lights and heating elements are typically resistive. Synchronous motors and fluorescent lights are typically inductive. Some capacitive-start motors appear capacitive before reaching full speed.

FIGS. 2(a)–2(e) show various waveforms associated with a power line feeding a resistive load through a persistent contact arc as functions of time. Trace 8 (FIG. 2(a)) shows the line voltage indicating the presence of high-frequency noise 9 throughout the cycle except during the gaps 10 and 11, that is, when the arc is not conducting. Gaps 10 and 11 are typically of similar duration during both half-cycles of the waveform, as shown. The amplitude of the noise is exaggerated for purposes of illustration. The duration of the gaps is indicated as $t_b$.

Trace 12 (FIG. 2(b)) shows the current through the load. The high-frequency noise generated by the conducting arc is also present on the current waveform, again exaggerated for clarity. Because the load is resistive the current 12 is in-phase with the voltage 8 (FIG. 2(a)), and goes to zero during the interval $t_b$ when the arc is not conducting. The high-frequency noise is again present throughout the cycle except during the gaps 13 and 14.

Trace 15 (FIG. 2(c)) shows the voltage across the arc. Trace 16 illustrates the line voltage, i.e., the voltage that would be present across the arc if the arc did not fire, and is included to illustrate the timing of the ignition and extinction of the arc with respect to the line voltage. Beginning at point 17, the voltage 16 across the arc is zero, so the arc does not conduct and therefore produces no noise. As voltage 16 rises, it reaches a point 18 where the arc ignites and begins conducting current. The voltage across the arc 15 does not go to zero when the arc is conducting because the now-conducting arc has an impedance, typically on the order of several or tens of ohms; consequently a voltage is exhibited across the arc. Furthermore, the arc tends to maintain a fairly constant voltage independent of the current though it. This is illustrated at 19 throughout the positive half-cycle and at 21 throughout the negative half-cycle. The arc produces high-frequency noise continuously during the time it is conducting. At point 20, the voltage across the arc lowers to the extinction level of the arc and the arc extinguishes. This process repeats on the negative half-cycle 21, and thereafter as long as the arc persists.

Trace 22 (FIG. 2(d)) shows the high-frequency noise extracted from either the line voltage 8 (FIG. 2(a)) or the load current 12 (FIG. 2(b)). In this case, the noise is generally shown in the higher frequency portion of the emitted spectrum, e.g., 1–10 MHz. A simple high-pass filter serves to remove the line frequency components. As shown, high-frequency noise is present throughout the cycle except during the intervals 23 and 24 when the arc is not conducting. During these intervals, or gaps, the high frequency noise is substantially attenuated, that is, reduced to the level of any background noise, which is normally much lower in amplitude than the amplitude of the noise due to arcing, as shown.

It will be noted that the amplitude of the high-frequency noise is somewhat higher immediately preceding and following the gaps, i.e., at points 25 and 26 respectively. When the arc extinguishes and re-ignites, the load current abruptly changes. At relatively low frequencies, e.g. 10 KHz to 1 MHz, this rapid change in load current on an essentially inductive distribution system produces additional high-frequency noise that will generally exceed the amplitude of the arc noise. Above 1 MHz, while the effect is still observed, there may be other, as yet not understood physical phenomena that contribute to its presence.

Trace 27 (FIG. 2(e)) shows a positive logic signal 27 responsive to the presence of high-frequency noise, i.e., signal 27 is high when high-frequency noise is present and low when noise is absent, as illustrated at points 28 and 29.

FIGS. 3(a)–3(e) show the same measurements of FIGS. 2(a)–2(e) with respect to a purely inductive load powered through a persistent contact arc. FIG. 3(a) shows the line voltage 30, FIG. 3(b) the load current 33, FIG. 3(c) the arc voltage 34, FIG. 3(d) the high-frequency noise 36, and FIG. 3(e) the logic signal 39 responsive to detection of high-frequency noise. As can be seen, the difference between these traces for an inductive load, and the traces illustrated in FIGS. 2(a)–2(e) for a resistive load, is that the gaps in the high-frequency noise 31 and 32 occur about 90° later in the voltage waveform. This is because the voltage across the arc 34 (FIG. 3(c)) is delayed by the inductance of the load. As can be seen, the inductance of the load also increases the noise generated when the arc extinguishes at point 37 and re-ignites at point 38. The position of the gaps when a contact arc is in series with a reactive load is thus displaced from the line voltage zero-crossings, but otherwise is essentially similar to the noise due to arcing in a circuit with a resistive load. If the load were purely capacitive, similar characteristic traces would show that the gaps lead the zero-crossings by 90°. In practice, the load will be somewhere between these limits, thereby producing gaps in the range of ±90° from each zero crossing.

In both FIGS. 2 and 3, the voltage at which the arc ignites depends on the size of the gap, the physical condition of the electrode surface, the temperature and the environmental conditions in the gap. Given that the sinusoidal waveform completes one full cycle every 360° the voltage V at any time can be expressed in degrees, i.e., $V = V_{peak} \sin \theta$, where $V_{peak}$ is the peak voltage reached and $\theta$ is the number of degrees from the zero-crossing. Arcs that ignite between $\theta = 60°–90°$ (145–167 actual V on a 118 V (RMS) line) tend to be highly intermittent and unstable because the gap is large. Arcs that ignite in the 20°–60° (57–145 V) range are still generally intermittent, tending to occur in short bursts and rapidly self-extinguishing. Arcs in the 1°–20° (3–57 V) range may, under certain conditions, persist and become self-sustaining. Arcs in this range emit an audible hiss and may develop extremely high temperatures in the surrounding materials. Thus arcs in the 1°–20° range are particularly dangerous.

According to the general method of the present invention, either the line voltage or the load current is monitored and the high-frequency noise extracted. The noise thus extracted is then monitored for the presence of gaps conforming to one of several "patterns" or "features" that occur at intervals equal to an integral multiple of one-half the line voltage period T. Commonly spacing of the gaps at intervals of T is required as a condition of detection of arcing. In one embodiment of the arcing detection algorithm, a "signature" potentially indicative of contact arcing is determined to exist if a predetermined number of gaps are found to occur spaced by successive intervals of length T. If the signature persists long enough, and/or meets certain further qualifying conditions, potentially dangerous arcing is determined to exist.

More specifically, the high-frequency noise is first monitored for specific gap features to determine if qualifying gap patterns are present. Three specific gap features and the relative advantages and disadvantages of the use of each to determine the presence of gaps indicative of arcing are discussed below.

The first and preferred gap feature, referred to as Feature 1, is characteristic of the leading edge of the gap. Feature 1 consists of an interval $t_a$, wherein high-frequency noise is substantially present, followed immediately by an interval $t_b$ of some minimum length, during which high-frequency noise is substantially absent. See FIG. 4(b), discussed in detail below. Typical values for $t_a$ and $t_b$ are 2 ms and 0.2 ms respectively. With the high-frequency noise typically persisting throughout the each half-cycle and gaps typically 1–2 ms long, these values are much shorter than those exhibited in well-formed arcing patterns, i.e., as exhibited by potentially dangerous arcs. In fact, these values effectively define a feature of the gap, namely the leading edge, rather than the whole gap. Consequently widely ranging gap widths and intermittent high-frequency noise can still be detected. Qualifying patterns are determined to be synchronous to the power waveform if the time from the start of an interval $t_b$ in any one feature to the start of interval $t_b$ in any subsequent feature is very nearly equal to the period T of the power waveform.

Again, it will be appreciated that "synchronous" in this context does not require that gaps be detected at any specific point on successive cycles of the power waveform, merely that the gaps be separated by intervals equal to integral multiples of the period T/2 of the half-cycle; preferably, for reasons discussed fully herein, gaps may be determined to be portions of signatures indicative of arcing if they are spaced by intervals equal to T, the period of the entire cycle of the power waveform, as measured to within a tolerance value Tol.

It will be appreciated that if the arcing is intermittent, multiple Feature 1 events can occur within each half-cycle, that is, there may be plural gaps in the noise. However, since the line voltage goes through zero only once each half-cycle, only one of these features will consistently repeat at the same temporal position, cycle after cycle, corresponding to extinction of the arc at the zero-crossing of the voltage. Other Feature 1 events that may occur are random in nature, generated by the arc extinguishing for other physical reasons during the time the voltage across the arc is relatively high.

It will also be noted that the synchronicity requirement for a Feature 1 event to qualify as a pattern is determined by measuring the interval from the start of one gap to the start of the next. The present inventor has discovered that this point, when the arc extinguishes due to the arc voltage declining below the sustaining voltage, occurs at more precise and repeatable intervals than the point when the arc re-ignites. This is likely because the physical arc conditions are established and stabilized when the arc voltage is high and therefore respond in a highly repeatable fashion as the arc voltage declines. When the arc re-ignites, on the other hand, the localized surface temperatures have cooled slightly and, electrons may jump between slightly different areas on the contact surface before re-establishing the arc, thus varying the arc re-ignition time somewhat from cycle to cycle.

The second gap feature that may be employed for gap identification, referred to as Feature 2, is characteristic of the trailing edge of the gap. A Feature 2 event consists of an interval $t_b$, wherein high-frequency noise is substantially absent, followed immediately by an interval $t_c$ wherein high-frequency noise is substantially present. See FIG. 4(c). Typical values for $t_b$ and $t_c$ are 0.2 ms and 2 ms respectively. Again, Feature 2 detects a feature of the gap, that is, its trailing edge, rather than the whole gap. Consequently widely ranging gap widths and intermittent high-frequency noise can still be detected. Qualifying features are determined to be synchronous to the power waveform if the time from the start of an interval $t_b$ in any one feature to the start of interval $t_b$ in any subsequent feature is substantially equal to an integral multiple of T/2, or preferably to T.

Accordingly, the principal difference between Feature 1 and Feature 2 is that the former measures the interval between leading edges of the gaps for testing synchronicity of successive gaps, while the latter measures the interval between trailing edges of the gaps. Although the present inventor has observed that the point at which the arcs extinguish is generally more accurate than the point at which the arcs re-ignite, there may be circumstances where the reverse is true, and in this case Feature 2 would be the preferable detection technique.

Feature 3 is a combination of Features 1 and 2. A Feature 3 event consists of an interval $t_a$, wherein high-frequency noise is substantially present, followed immediately by an interval $t_b$, wherein high-frequency noise is substantially absent (the gap), followed immediately by an interval $t_c$ wherein high-frequency noise is again substantially present. See FIG. 4(d). Qualifying features are determined to be synchronous to the line if the time from the start of an interval $t_b$ in any one feature to the start of interval $t_b$ in any subsequent feature is very nearly equal to an integral multiple of T/2 or, preferably, to T. Feature 3 requires that high-frequency noise be present on both sides of the gap and therefore establishes limits on the width of the gap. This, in turn, makes the detection more selective because the gap width must fall within these limits before qualifying as Feature 3. Employment of Feature 3 can, however, prevent the algorithm from detecting arcing from loads that are half-wave rectified, since in some cases one edge of the gap may not be clearly defined by noise.

Accordingly, the first step in detecting a signature possibly indicative of arcing is to monitor the noise to identify gaps by a specific feature of each gap, and to then determine whether this feature repeats at intervals equal to integral multiples of T/2. In the preferred embodiment, as illustrated in the following examples, the detection interval is T.

Figure 4A:
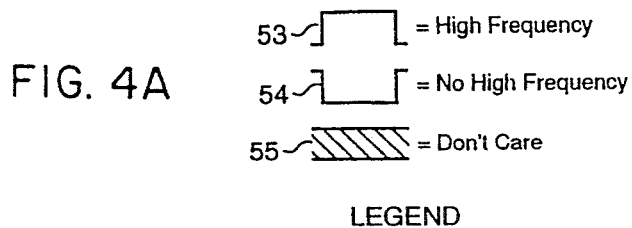
FIGS. 4(a)–4(d) illustrate three characteristic patterns of high-frequency noise produced by contact arcing and detected by the method of the present invention.

Examples of logic signals corresponding to detection of gaps identified by the three different gap features discussed above are illustrated in FIGS. 4(a)–4(d). The three logical states used in FIGS. 4(b)–4(d) to represent the presence or absence of noise are explained in the legend (FIG. 4(a)). A high logic signal 53 indicates the presence of high-frequency noise, i.e., the logic signal is high when the amplitude of the monitored high-frequency noise exceeds some threshold level, e.g., during interval $t_a$ at 57 in FIG. 4(b). A low logic signal 54 indicates that the high-frequency noise is substantially attenuated, i.e., that the amplitude of the high-frequency noise is below a predetermined threshold level, as exemplified by period $t_b$ at 58 in FIG. 4(b). The hatched pattern 55 indicates periods during which the amplitude of the high-frequency noise does not matter, i.e., that the output of the arc detector is not responsive to presence or absence of high-frequency noise during this interval, as exemplified at 56 in FIG. 4(b).

Figure 4B:
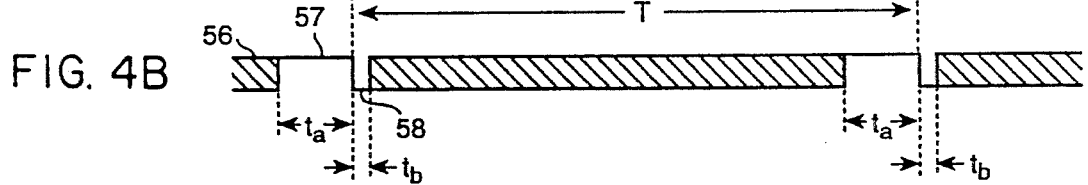

Referring now to FIG. 4(b), two successive instances of gaps identified responsive to detection of Feature 1 are illustrated. For a gap to be identified by detection according to Feature 1, the high-frequency noise signal must be present during the interval $t_a$, and absent during the successive interval $t_b$. To qualify as a signature indicative of arcing, successive identifications of gaps conforming to Feature 1 must be spaced such that the interval from the start of interval $t_b$ to the start of the next interval $t_b$ is equal to T±Tol, where Tol is the specified tolerance on measurement of the interval between successive gaps. Accordingly, Feature 1 detection amounts to measurement of the time interval between successive leading edges of the gap.

Figure 4C:
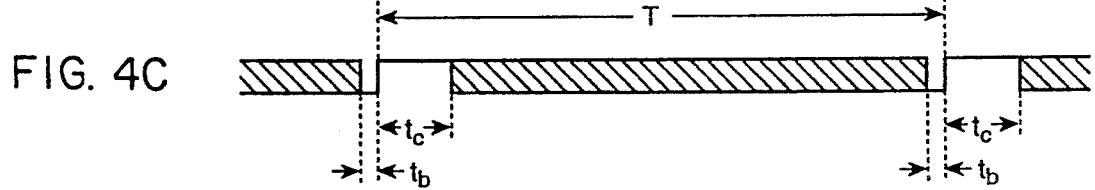

FIG. 4(c) shows two successive instances of gaps conforming to Feature 2. To qualify as a gap pursuant to Feature 2, the high-frequency noise signal must be absent during the interval $t_b$, and present during the interval $t_c$. To qualify as a signature indicative of arcing, successive instances of Feature 2 must be spaced such that the interval of time from the end of interval $t_b$ to the end of the next interval $t_b$ is equal to T±Tol. Thus Feature 2 detection amounts to measurement of the spacing in time between successive trailing edges of gaps.

Figure 4D:
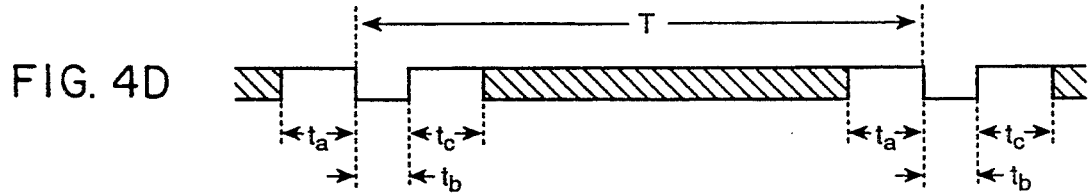

FIG. 4(d) shows two successive instances of gaps conforming to Feature 3, wherein both leading and trailing edges of the gaps must conform to the stated pattern. To qualify as a gap pursuant to Feature 3, the high-frequency noise signal must be present during the interval $t_a$, absent during the interval $t_b$, and again present during the interval $t_c$. Since Feature 3 specifies both edges of the gap, the range allowed for $t_b$ specifies the minimum and maximum width of the gap, and therefore is more restrictive than Features 1 and 2. This may be desirable to increase the noise rejection capability in some applications. The allowable gap width $t_b$ in Feature 3 detection may be adjusted for optimum performance in any given application. To qualify as a signature possibly indicative of arcing, successive gaps conforming to Feature 3 must be spaced such that the interval of time from the start of interval $t_b$ to the start of the next interval $t_b$ is equal to T±Tol. In particular applications, it may be advantageous to measure the interval between the end of interval $t_b$ and the end of the next interval $t_b$.

As noted, regardless of the feature selected for gap identification, the gaps may occur anywhere relative to the line frequency, i.e., there is no required phase relationship between the gap pattern and the line voltage zero-crossings, so that detection takes place regardless of the load reactance. If it is desirable to limit the arc detection to a specific load reactance, the gap can be further required to appear in a specific temporal position relative to the line voltage before determining that an arc exists. For example, if the gap is required to exist in the vicinity of the zero-crossings of the line voltage, the only arcs that will be detected are those in series with a resistive, i.e., non-reactive load. To take advantage of this feature, the line voltage should be monitored, rather than the current, because the position of the gap on the current waveform can vary as a function of other reactive loads on the line. In another feature of the invention, the position of the gaps with respect to the line frequency waveform may be determined to identify the type of load in series with the arc, as an aid in locating the arc.

In all three cases, successive gaps are preferably required to be detected at intervals equal in time to T, rather than T/2. It would also be possible to require the gaps to be detected at other integral multiples of T/2, as in most cases the gaps are in fact present at intervals of T/2. However, there are two distinct advantages to using T instead of T/2. First, if the load is half-wave rectified, the high-frequency noise will appear only on alternate half-cycles and consequently the gap will repeat only once every full cycle, i.e., at intervals of T. Therefore, to enable detection of arcing in series with half-wave rectified loads, the interval should be set to T. Second, gaps that occur at full-cycle intervals result from extinction of the arcing under precisely the same conditions, i.e., the same polarity of the arc voltage, and therefore are more repeatable and more reliably detected.

It will be appreciated that certain of the features, e.g., the leading edge of the gap, may be spuriously detected due to random high-frequency noise. Therefore, to prevent the device from spurious tripping on random noise, and according to another aspect of the invention, the detection algorithm includes further conditions which must be met prior to the identification of arcing, in order to effectively reject random noise events. For example, the detection algorithm may require that n identical features occur in succession at intervals equal to T.

The probability of n qualifying features occurring in a row from random noise is:

$$p(nHits) = \left( \frac{2\epsilon Tol}{T} \right)^n \quad (1)$$

where:
$p(nHits)$ = probability that n qualifying features will occur in a row
$\epsilon$ = number of random events per T
Tol = interval tolerance (±sec)
T = line voltage period (sec)
n = number of successive gap features required For example, if we assume an average of 10 random events that exhibit the characteristics required of a feature per T (16.66 ms at 60 Hz), a tolerance Tol of ±100 μs, and set n equal to 3, the probability that noise will trigger the device is 0.0017, or approximately one in 570 cycles. If n is raised to 5, this decreases to one in 39,390. With n set to 10, we can expect random noise to qualify as a pattern indicative of arcing only one in 1,500,000,000 cycles.

Once the high-frequency noise on a given line has been determined to be characteristic of arcing, that is, when a signature of gaps possibly indicative of arcing has been identified, the next step in the method of the invention is to determine whether this arcing persists long enough to be dangerous, this time being typically on the order of a few seconds. This can be accomplished by simply increasing n to a very high value, e.g., 100. This approach, however, requires that the arcing persist, without interruption, for n cycles in succession. In practice, the inventor has found that with persistent arcing across copper contacts, the arc may occasionally extinguish for a cycle or two, thereby being disqualified as a dangerous arc if n is set too large. This likely results from the eventual physical melting and reforming of the contact areas in response to the heat generated by the arc. A better approach, therefore, is to employ a method whereby a signature of gaps possibly indicative of arcing is first determined to exist, e.g. by requiring that n gaps are detected in successive cycles, n being chosen to provide reasonable rejection of random noise, e.g., n=5, and then to integrate the number of qualified signatures that occur with respect to time until a predetermined threshold is reached.

More generally, arc identification according to the invention requires that gaps be detected at intervals equal to integral multiples of T/2 during at least a substantial fraction of at least a minimum number of cycles. Stated differently, some minimum number of gaps must be detected at intervals spaced by T/2 or multiples thereof within a minimum period of time. Further conditions may include that a number of gaps be detected at successive intervals, for example, of T/2, or of T.

In one specific embodiment, a simple counter, the 'Score' counter, is employed to effectively integrate gap detection. When a feature indicative of a gap is detected, a timer records the interval of time that has elapsed since detection of the prior feature. The timer also analyzes previously recorded intervals to determine if there were n previous features spaced T seconds apart. If so, a 'hit' is said to have occurred (i.e., the arcing 'signature' has been 'recognized') and the Score counter is incremented. If T seconds then elapse without a further 'hit', the Score counter is decremented. If the Score counter reaches a predetermined count or threshold, the determination is made that dangerous arcing is present. In this manner, the algorithm will reliably detect arcing with up to one out of every n+1 gaps missing.

This dual-step method of arc detection offers both high noise immunity and the ability to tolerate occasional anomalies in the arcing pattern. The first step establishes the high-frequency noise as arcing noise by detecting a synchronous pattern or signature of gaps including at least n synchronous gaps in succession. The second step effectively integrates the signature over time, to determine if the arcing is persistent enough to present a hazard.

It will be appreciated that two signatures, each signature having n successive features occurring T seconds apart, can occur simultaneously, one on each phase of the cycle, that is, one on the positive half-cycles, and one on the negative half-cycles of the power waveform. According to one aspect of the invention, these two sets of patterns may be treated independently, each incrementing or decrementing the Score counter as they occur, quite independent of one another. This has the added advantage that the same algorithm will detect arcing on both full-wave loads and half-wave rectified loads. If the load is half-wave rectified, gaps will occur on one phase only and consequently the Score counter will take twice as long to reach the threshold. Since the energy dissipated in the arc on a half-wave load is one-half the energy dissipated in the arc on a full-wave load, this is the desired result. Similarly, if gaps are occasionally missing, this means that the arcing has been momentarily interrupted and the trip time is correspondingly longer.

Selection of the value for the minimum gap length $t_b$ should be made responsive to several factors. First, although a particular load type will tend to produce very consistent gap widths from cycle to cycle, the gap width is highly dependent on both the complex impedance of the load and the physical conditions of the arc. In general, persistent arcing has been found to produce relatively short gap widths. While intermittent arcing tends to produce gap widths ranging from about 20°–90° of the line cycle, persistent arcing is nearly always in the range from about 1° to 20°. It will be noted that Features 1 and 2 do not limit the maximum width of the gap, but rather require only that the gap be a minimum width that is equal to or greater than $t_b$. Therefore, if $t_b$ is set to 1° (46 μs) the only width requirement for either feature is that the gap be greater than 1° long. In practice, due to the processing speed capability of the microprocessor used, $t_b$ is usually set to several degrees or more. If Feature 3 is used, limits must be set on the width $t_b$ of the gaps, generally about 1°–20°.

The selection of the value for $t_a$ is again a function of several considerations. Under optimum conditions, the high-frequency noise will persist during the entire cycle, except during the expected gaps $t_b$ when the voltage across the arc drops below the arc sustaining voltage. However, in real-world conditions, the signal responsive to high-frequency noise may not persist continuously during this time. One problem, illustrated in FIGS. 5(a)–5(c), results from the variation of noise amplitude across the cycle with respect to the ability to accurately set the noise detection threshold.

Figure 5A:
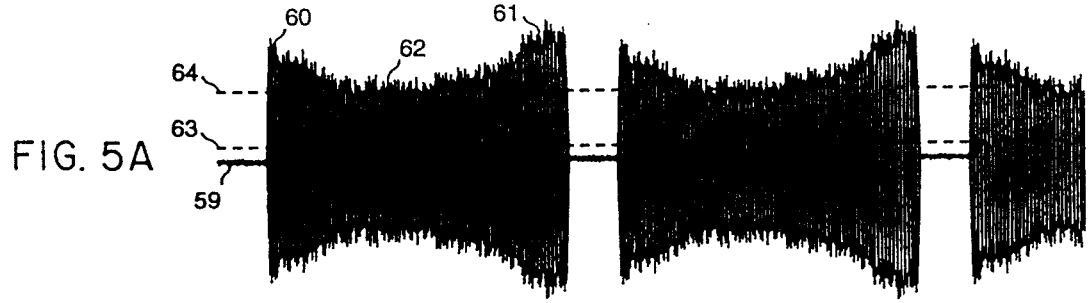
FIGS. 5(a)–5(c) show the effect of the threshold level on the output of the high-frequency preset noise comparator.
Figure 5B:
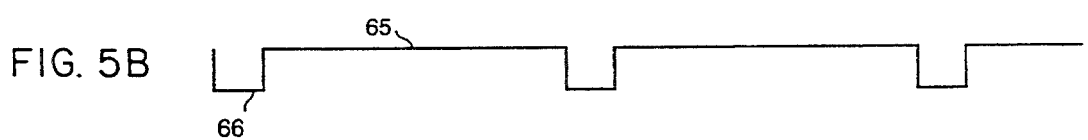
Figure 5C:
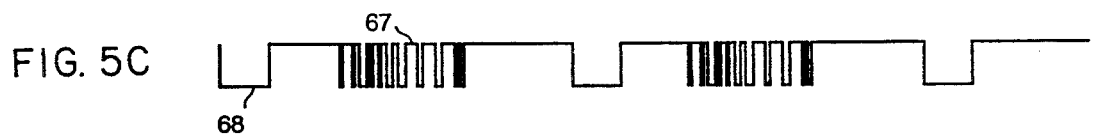

Referring now to FIG. 5(a), a high-frequency noise pattern 40 typical of persistent arcing is shown. As discussed previously, the noise is higher in amplitude just before and after the gaps than between the gaps 62, as shown at 60 and 61. If the threshold for detection of gaps in the high-frequency noise is optimally set to a relatively low level 63, then the resulting logical pattern (FIG. 5(b)) will be nearly ideal. If, however, the threshold is set higher, as shown at 64, the noise may occasionally dip below the threshold in the middle of the cycle and produce logic noise 67 in the output. Therefore, while $t_a$ (or $t_c$) might otherwise be set to T/2 less the maximum expected gap width, it is advantageous to set $t_a$ (or $t_c$) to a smaller value, typically about ⅛ the line cycle or 2 ms. In this manner, the requirement of the feature is that high-frequency noise exist in the areas where it is the highest, just before or just after the gap.

The present inventor has observed that the "saddle" or "bowtie" variation in the amplitude of the noise between successive gaps evident in FIG. 5(a) (see also FIGS. 2(a) and 3(a)) is characteristic of noise due to arcing. While detection of arcing by monitoring the noise for gaps represents the preferred embodiment of the invention (gap detection as described herein having a very high signal-to-noise ratio) it is also within the invention to detect arcing by monitoring the noise waveform for other such features that are synchronous to the fundamental frequency of the power waveform, where not excluded by the language of the following claims.

Referring now to the problem of avoiding false indications of arcing due to noise from other sources, there are two basic types of extraneous noise present on power lines in the 1–10 MHz frequency range. The first is very short-lived impulse noise from lamp dimmers, switching power supplies, and the like. This type of noise can be rejected simply by making the intervals $t_a$ and $t_c$ longer than the maximum impulse noise duration. Since typical impulse noise extends no longer than several hundred microseconds, and since the typical requirement for $t_a$ or $t_c$ is several milliseconds or more, this type of extraneous noise is easily rejected.

The second type of noise commonly found on power lines is interference from local AM radio broadcast stations. This noise is particularly apparent when the gain of the system is made high enough to detect even distant and low-power arcing. While this type of noise may produce occasional qualifying patterns through random coincidence, this noise has no temporal relationship to the line frequency and therefore will not produce repetitive patterns synchronous with the line frequency. Therefore, this and other non-line-synchronized forms of extraneous noise are also effectively ignored.

A third type of noise commonly present is due to arcing in electric motors with brush contacts. A typical example of this is the common household drill. Such motors produce a substantial amount of high-frequency noise in the 100 KHz–1 MHz range but much less in the 1 MHz to 10 MHz range. In either case, however, the noise does not ever go to zero; it is present throughout the cycle. This is likely due to the mechanical momentum of the rotating armature and the back EMF produced. In any case, the lack of a gap in each half-cycle of the line frequency prevents false triggering of the arc detection device according to all three patterns of the present method.

A fourth type of noise sometimes present is communication signals from carrier-current transmitters. There are a number of devices on the market that provide remote control of appliances by using carrier-current transmission techniques to convey information over the power lines. These are typically tuned to transmit bursts in the 100–300 KHz range. The amplitude of the noise in the 1–10 MHz frequency range is again very low because noise in this band would interfere with AM radio broadcasts and is therefore intentionally minimized by the manufacturer.

Figure 6:
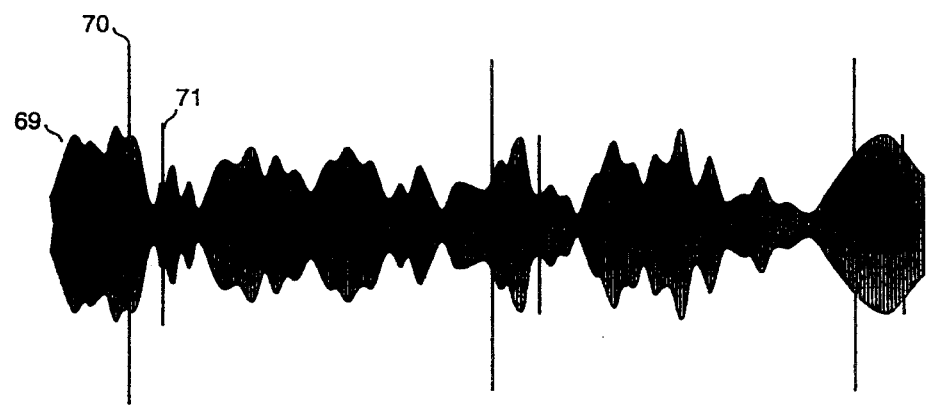
FIG. 6 shows line voltage and high-frequency noise generated by impulse noise sources and broadcast radio interference.

FIG. 6 shows typical extraneous noise found on household wiring in the 1–10 MHz range. The modulated waveform 69 is typical of AM radio transmissions picked up on household wiring. The amplitude variations, though not random, have no temporal relationship to the line frequency and consequently will not trip the detector.

Typical impulse noise, from lamp dimmers and the like, is also shown in FIG. 6. Two spikes 70, 71 are illustrated that occur synchronously to the line power. Since feature detection according to the invention requires high-frequency noise to be detected for a minimum interval ($t_a$) the high-frequency is required to be on is typically 2 ms or more, and since such impulse noise spikes are always 0.1 ms or less in duration, these spikes do not cause the detector to falsely trip.

It will be appreciated that the relative danger from fire due to arcing is a function of the power dissipated in the arc. The power dissipated in the arc represents the rate of heat production and is approximately proportional to the load current. The energy (total heat) produced is this power multiplied by the time the arc is conducting. While the load current is not directly sensed and therefore not directly taken into account by the present detection method, the detector of the invention does in fact respond more rapidly to high-current arcing, for two distinct reasons. First, the amplitude of the high-frequency noise produced by the arcing is approximately proportional to the level of current through the arc. Therefore, high-current arcing will produce very clear noise signatures with a high signal-to-noise ratio leading to rapid and reliable detection. Second, the heat produced by the arc lowers the thermionic emission threshold at the contacts, enhancing the physical processes that cause the arc to become persistent and self-sustaining. Therefore, the higher the load current the faster persistent arcing patterns will develop.

To this point, and relative to the methods discussed so far, it does not matter whether the high-frequency noise examined according to the invention is extracted from the line voltage or the load current. According to the invention, either load current or line voltage (or both) may be monitored for arc detection. There are, however, several distinct differences between the two approaches, each providing relative advantages and disadvantages. As discussed below, radio-frequency energy emitted from household wiring may also be similarly monitored.

The first embodiment of the invention is a plug-in, night-light style alarm, monitoring line voltage so that high-frequency noise originating anywhere on the line or within most equipment will be detected. This is advantageous because the alarm in this embodiment can conveniently monitor an entire household by monitoring noise on the plug contacts, i.e., the line voltage.

In the second embodiment of the present invention, the arc detection circuit controls a circuit breaker capable of interrupting the current to the load when arcing is detected. In this application it is desirable to monitor only that noise which originates on the protected circuit. Therefore, the current flowing to a particular load is monitored and the high-frequency component extracted. The only noise present will be that which is generated by sources on that circuit. Also, since the circuit breaker is wired in series with the load, a current-carrying conductor is available for current monitoring. For these two reasons, the use of high-frequency current monitoring is advantageous in this application.

In yet a third embodiment of the invention, the detection circuit is packaged in a battery-powered, wireless detection device that monitors the high-frequency emissions from the power wiring through a self-contained receiving antenna. This device works best in the higher end of the frequency spectrum (1–100 MHz) because a relatively short antenna can be used.

A prototype circuit built according to the invention examined the line voltage for high-frequency noise in the range of 5–10 MHz. The detection algorithm was implemented in a Microchip Technology, Inc. PIC16C54 microprocessor and the device was housed in a convenient plug-in enclosure. It used Feature 1 detection of gaps, where $t_a$ and $t_b$ were set to 2 and 0.2 ms respectively. The interval tolerance was set to 128 μs and the threshold for the Score integrator (as described in detail below) was switchable from $2^0$ to $2^8$. This prototype's response was tested extensively with a variety of loads. The alarm was tripped repeatedly and reliably when a 150 watt light bulb anywhere on the circuit was powered through a persistent short arc, yet did not trip from interference originating from lamp dimmers, carrier current transmitters, fluorescent lights, motor speed controllers, load switching, or broadcast radio interference. In a further experiment, a variable speed electric drill would not trip the alarm even at close range and despite the large amount of high-frequency noise generated. However, when the same drill was powered through a short arc, the alarm tripped whenever the arc carried current.

Figure 7:
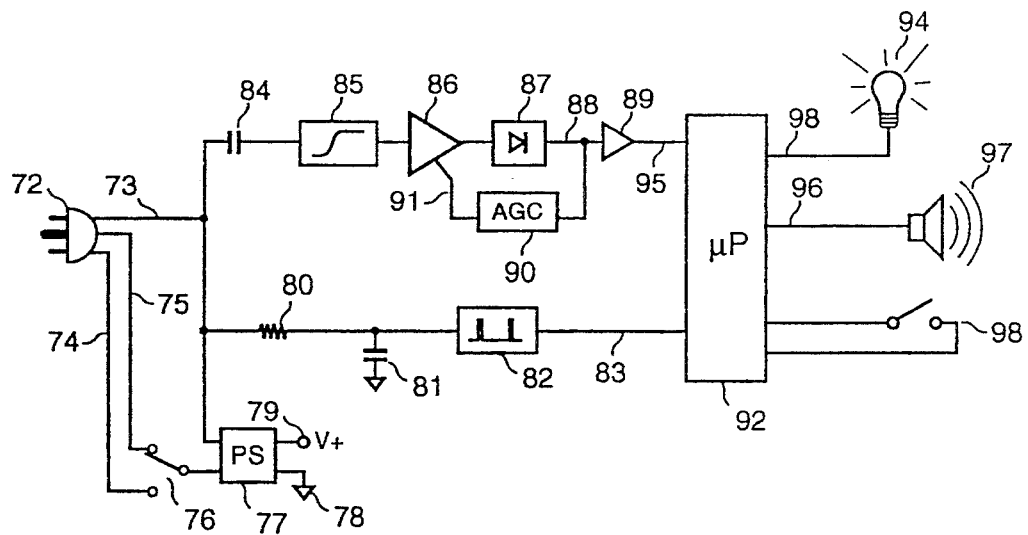
FIG. 7 is a block diagram of a circuit according to one embodiment of the invention as used to warn the user of the presence of contact arcing.

FIG. 7 shows a simplified block diagram of an arc detector monitoring noise in the line voltage for characteristic patterns of noise according to the invention. The detector of FIG. 7 provides both visual and audible warnings to the user.

A standard plug 72 connected to the power line provides both power and signal connection to the detector through the high conductor 73, neutral conductor 74 and ground 75. An optional switch 76 allows the unit to be powered and to sense high-frequency noise either line-to-line or line-to-ground. The normal mode of operation is line-to-line but the device may perform better line-to-ground in some applications.

A power supply 77 provides regulated DC voltage V+ at 79 to operate the unit. V+ is a convenient low voltage, typically 5 or 12 volts. Circuit common is depicted at 78. The processing circuitry, lamp, and audible indicator can be made to operate at under One watt total, so that it is convenient to configure the power supply as an AC–DC converter using a capacitor as the voltage dropping element. It is preferable to use a half-wave rectifier so that the line neutral 74 or ground 75, depending on the setting of switch 76, can be made circuit common 78. This simplifies the signal detection coupling. The Maximum Integrated Products MAX611 AC to DC Regulator chip works well in this application, producing 5 V DC at up to 150 ma from 120 or 240 VAC input.

An optional zero-crossing detector 82 functions to produce a narrow pulse (10°–100°) at each zero-crossing of the line voltage. Zero-crossings are conveniently sensed through a high-value resistor 80. Conventional techniques produce an output pulse responsive to each zero-crossing. The output of the zero-crossing detector 80 is supplied to an input 83 of a microprocessor 92. Microprocessor 92 employs the zero-crossing pulse to measure the line frequency and determine the correct line period for use in the detection algorithm. In this manner, the device can be used in other countries where the line frequency varies from 60 Hz. Zero-crossing detection can also be used to relate the presence of gaps in the noise to the phase of the line voltage in order to make the device selective to arcing in series with particular types of loads, i.e., loads with specific reactance. In order to maintain the timing information accurately in the presence of high-frequency noise, a capacitor 81 can be added to input resistor 80 to produce a low pass filter. A single-pole filter response with a corner frequency of about 100–1000 Hz works well.

The high-frequency noise is conveniently sampled through a small coupling capacitor 84 forming part of a high-pass filter 85, or a tuned band-pass filter to remove the line voltage frequency. The noise is then amplified by gain-controlled amplifier 86 and detected by detector 87. Detector 87 functions as a full- or half-wave rectifier to detect the high-frequency components and produce a rectified signal responsive to the amplitude of the noise. This detector 87 is preferably a biased square-law diode detector or a multiplying detector, both of known type, to provide sensitivity in the sub-millivolt range. The output of the detector 88 is fed to an automatic gain control (AGC) circuit 90 whose output feeds the gain-control input 91 on the signal amplifier 86. The AGC circuit is desirably configured to produce a substantially constant average noise amplitude at point 88 over a range of 60 dB or more of input noise amplitude. The resulting gain-controlled noise signal 88 is fed into a comparator 89 to compare its amplitude to a predetermined threshold value and produce a logic-level signal 95 responsive to the presence of high-frequency noise of average amplitude above the threshold value. Logic-level signal 95 is supplied to microprocessor 92 for implementation of the detection algorithm according to the invention.

As noted previously, the bandwidth of a contact arc extends from about 10 KHz to about 1 GHz. The selection of the preferred bandwidth of noise analyzed according to the invention to detect arcing is a function of the desired performance of the device. Clearly, the frequency band must first be high enough to sufficiently reject the 50 or 60 Hz power line frequency. Any frequency above about 10 KHz will suffice for this purpose. In the frequency range between about 100 KHz and 1 MHz, there is a considerable amount of extraneous synchronous line noise from common household sources. If noise in this bandwidth is to be analyzed to detect the presence of gaps, the detection algorithm must be designed to reject noise from these sources. The parent application describes a variety of methods whereby such noise can be rejected and arcing in this frequency range can be reliably detected. In the frequency range between about 1 MHz and 10 MHz, the preferred frequency band for the embodiments of the invention disclosed in the present application, such extraneous synchronous line noise is substantially absent or very limited in duration. However, because the bandwidth of arc noise is so wide, virtually any frequency bandwidth can be used if conditions warrant. In the prototype, a low-Q tuned input filter with a passband of about 5–10 MHz was used.

The power wiring in most buildings in the United States is flat three-conductor cable with the center conductor ground. Romex and Amerflex are commercial examples of this type of cable. While these cables are well specified in the 100–300 KHz range, little information is available on the attenuation characteristics in the higher frequency range. The attenuation across a typical home was found to vary between about 10 and about 80 dB, depending on the distance between the arc and the detector, the loads present in the circuit, and on whether the load and the detector were on the same phase.

The gain required for the present invention to work well over an entire household or business is on the order of 40 to 80 dB. With a gain of 70 dB, the device appears to work well across both phases in one test installation. The amplifier must behave well when clipping and provide quick turn-off time to avoid extending the width of high-amplitude pulses. Clipping diodes at the input and a limiter or automatic gain control device can be incorporated into the amplifier to accomplish these goals.

The microprocessor 92 is preferably a low-cost, single-chip processor with integral ROM and RAM operating at 1–20 MHz. Microprocessor 92 drives one or more alarm indicator lamps indicated at 94 via control line 98, drives an audio annunciator 97 via control line 96, and accepts input from the user via switch 98. The tasks microprocessor 92 must perform depend on the precise variations used on the method of the invention.

More specifically, the microprocessor, by monitoring the logic-level signal indicative of the presence or absence of high-frequency noise, can detect gaps conforming to any of the Features disclosed in the parent application, additional detectable patterns in the noise characteristic of arcing, or the patterns discussed in issued U.S. Pat. No. 5,223,795, and can determine whether the selected Feature or pattern is synchronous to the power waveform and persists sufficiently long to satisfy the conditions for determining that arcing exists. As discussed above, in the preferred embodiment of the parent application one of several Features is selected; if the microprocessor detects the selected Feature at synchronous intervals during more than a predetermined fraction of the cycles of the power waveform, a signature indicative of possible arcing is considered to have been detected; and if the signature persists for an appropriate period of time, arcing is considered to have been detected and an appropriate control action taken.

In one convenient implementation of the invention as described in the parent application, the microprocessor saves the time at which each Feature is detected in a circular buffer, typically eight registers long, together with a 'Hit' value saved in a corresponding set of eight registers. As each subsequent Feature is similarly detected, the microprocessor compares the new time to previous times stored in the circular buffer to determine whether a Feature had been detected T seconds prior to the time of detection of the present Feature, within a tolerance Tol. If so, a 'Hit' is said to have occurred and the 'Hit' register for that position in the buffer is incremented; if not, the Hit register for that position is cleared to zero. In this manner, the Hit registers, one for each position of the circular buffer, contain the number of successive Hits that have occurred at various relative positions along the waveform. If any of the Hit registers reaches n, the number of successive Hits required for a signature, the Score counter is incremented and the Hit register is reset to 1. If one or more line cycles go by without any Hits, the Score counter is decremented. If the value stored by the Score counter reaches a predetermined value, arcing is determined to have occurred.

In essence, the microprocessor carries out all these tasks; programming a microprocessor to do so is within the skill of the art. The microprocessor might alternatively be programmed to otherwise detect appropriate sequences of detection of patterns of high-frequency noise characteristic of arcing, for example, integrating the number of synchronous gaps detected during a predetermined interval as disclosed in the parent application, or in other equivalent ways, specifically including monitoring of the high-frequency noise on the power line for synchronous occurrence of the 'bowtie' or 'saddle' pattern discussed above in connection with FIG. 5(a). Randomness and bandwidth tests as described in the issued U.S. Pat. No. 5,223,795 can also be incorporated, to further differentiate noise due to arcing from other sources of high-frequency noise.

In a further enhancement, the microprocessor can measure the phase of the gaps in the noise relative to the zero-crossings of the power waveform, in order to identify the load in series with the arc as inductive, resistive or capacitive. A indication responsive to this determination may be provided to the user in locating the arcing.

Figure 8:
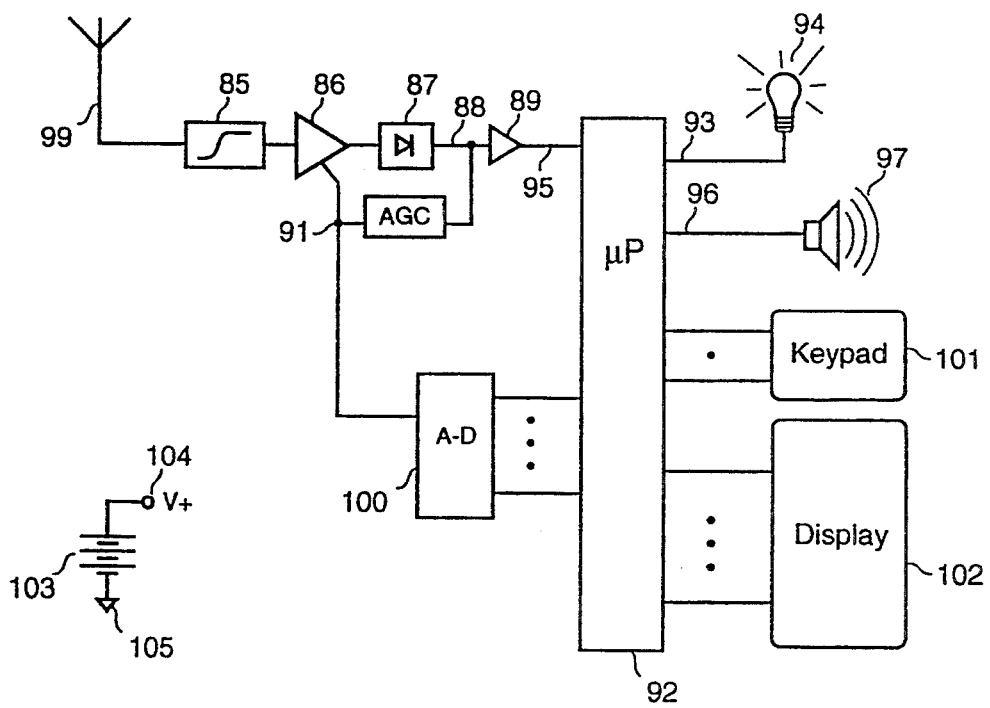
FIG. 8 is a block diagram of a circuit according to another embodiment of the invention as used to diagnose the source of the arcing.

FIG. 8 shows an embodiment of the arc detector of the invention configured as a diagnostic device, e.g., for use by a repairman to quantify and locate intermittent arcing somewhere within a household or the like before the arcing reaches dangerous levels. In this embodiment, radio-frequency energy responsive to the noise on the power waveform is coupled to the detector via an antenna 99. Typically, the detector in this embodiment may be successively disposed in the vicinity of various likely sources of arcing, or may be placed in the vicinity of a suspected source of arcing and left for a period of time to record arcing events. The detector may also be plugged into the power distribution wiring to establish the timing of the waveform for load type identification, as discussed above. The detection circuit employed in the embodiment of FIG. 8 is substantially similar to the circuit described in FIG. 7, as indicated by use of the identical reference numerals. For convenient hand-held use, the detector may be powered by a battery 103 connected between circuit V+ at 104 and common at 105. A keypad 101 and display 102 are provided to enable the user to access internal registers of the microprocessor storing relevant characteristics of the detected arcing, such as the nature of the load—resistive, capacitive, or inductive—the length and timing of the arcing detected, and the like. The gain control -5 feedback signal may be converted to a digital value by an analog-to-digital converter 100 and supplied to the microprocessor 92 for further analysis, e.g., to allow display of the relative amplitude of the arcing noise with respect to background noise on the power line.

Figure 9:
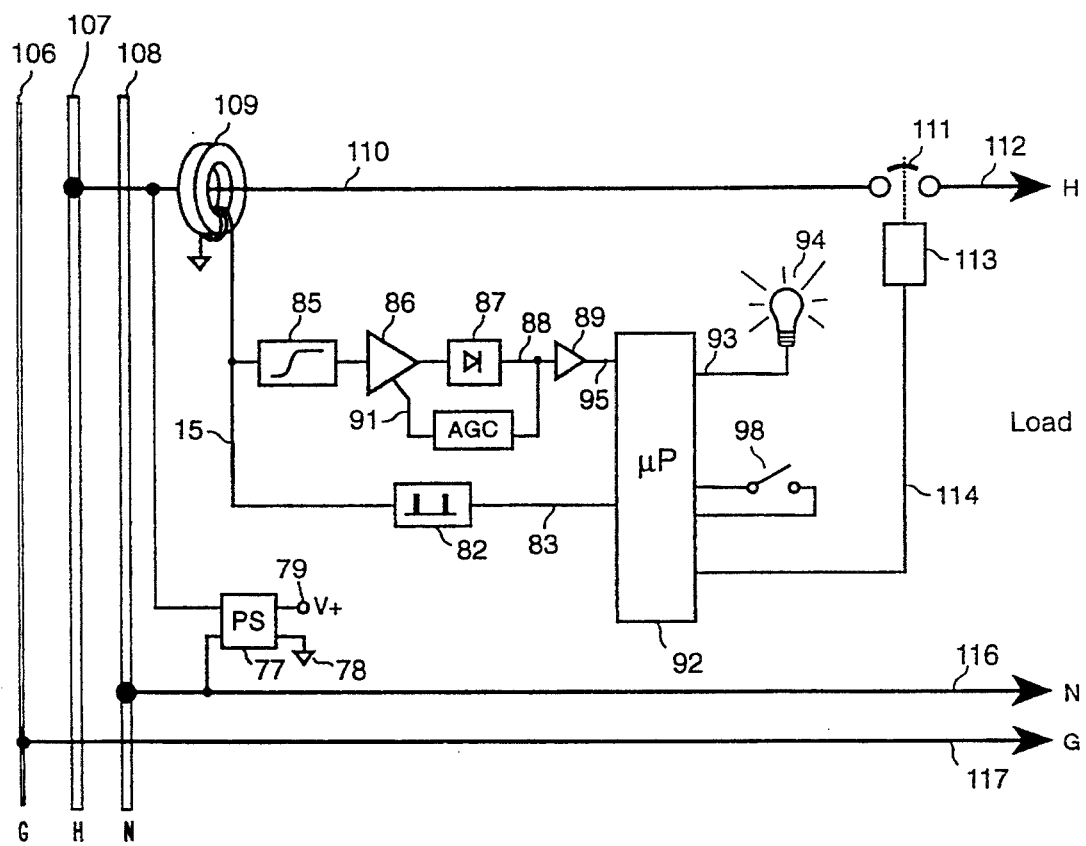
FIG. 9 is a block diagram of a circuit according to a further embodiment of the invention as used both to warn the user and to trip a circuit breaker automatically when contact arcing is determined.

FIG. 9 shows a simplified block diagram of an arc detector according to the invention, in this embodiment sensing the current for arc detection and interrupting current flow to the load when arcing is detected. This apparatus employs the same basic detection circuit described in FIG. 7, but is configured to provide power to a load and to interrupt current to the load in the event that a predetermined level of arcing occurs.

As shown in FIG. 9, the main power lines, consisting of high 107, neutral 108 and ground 106 conductors, provide power to the load through a switch element 111 controlled by a solenoid 113 of a conventional circuit breaker (i.e., also providing overcurrent protection) to high, neutral, and ground conductors 112,116, and 117, respectively. The high line is routed through a current transformer 109 having a pass band of 1–10 MHz, that monitors current to the load. A zero-detection circuit is used to monitor the line voltage if it is desired to have the same device operable in systems having differing line frequencies, as in other countries. The current transformer 109 monitors only current flowing to the load, thereby isolating the arc detection circuit from arcs generated on the individual circuit protected by breaker 113.

The detection circuit employed in the embodiment of FIG. 9 is substantially similar to the circuit described in FIG. 7, as indicated by use of the identical reference numerals. A conventional electrically-actuated circuit breaker with an actuating coil 113 driven by a control line 114 from the microprocessor controls a circuit breaker contact 111 disposed in-line between the high conductor 107 and the load, in order to interrupt power flow to the load when the microprocessor 92 determines that an arc of sufficient magnitude and duration has occurred, or if an overcurrent occurs.

The detector circuit of FIGS. 7, 8, and 9 and the discussion to this point refer to a detector operating on one phase of a 220 VAC split-phase power line, as is commonly found in residences. It should be understood that the present invention may be applied to power systems with any voltage and phase configuration. All that is required is to provide a detector across each phase to be monitored.

Figure 10A:
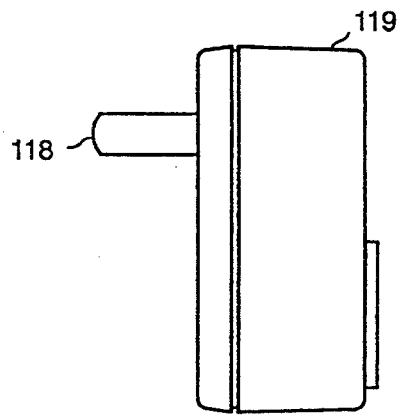
FIGS. 10(a) and 10(b) are front and side elevational views respectively of a physical package for the circuit of FIG. 7.
Figure 10B:
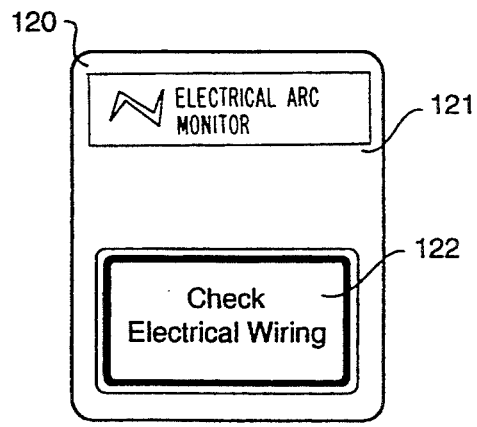

FIGS. 10(a) and (b) show respectively side and front elevational views of one suitable packaging approach for housing the circuit shown in FIG. 7. A plastic injection-molded case 119 houses the complete detector. A combination indicator/switch 122 serves to both indicate the presence of an arc and to reset the light when the unit is in the hold mode.

Referring now to the side view illustrated in FIG. 10(a), the package is designed to be plugged directly into a conventional 3-prong wall outlet and is self-supporting on the plug terminals 118. These terminals, or other terminal types for 2-prong domestic or international applications, are mounted or molded directly into the plastic package 119. A legend 121 on the face 120 of the unit warns the user to seek assistance if arcing is detected.

FIG. 11 shows a front view of one possible package for the radio-coupled version of the detector of the invention as optimized for diagnostic use. The circuit of FIG. 8 is disposed in a case 123 having a folding, telescoping antenna 124 for radiative coupling of energy from the waveform. A text display 125 provides various data useful in determining the source of arcing, as indicated. Barograph displays 127, 128 compare the relative levels of the noise examined for the presence of arcing and the background noise on the line. Pushbuttons 129 provide suitable control options. It will be apparent that many other arrangements are within the scope of the invention. As noted, the diagnostic version of the detector may further comprise a plug-in connection for establishing the relation of the arc gaps to the zero-crossings of the line power, allowing identification of the type of load.

FIGS. 12(a) and (b) show side and front views, respectively, of one suitable packaging approach for housing the current-monitoring circuit of FIG. 9 in a dual-outlet enclosure similar to commonly available ground fault interrupters. A molded plastic case 132 houses the entire assembly. Screw terminals 131 and 133, together with two further terminals on the other side and a ground terminal, serve as connections to attach the line, load and ground conductors. A metal bezel 130 fits around the case 132 and serves to mount the device in conventional outlet boxes. Two outlets 135, 138 provide the load connections. A test switch 136 will manually trip the circuit breaker when pressed to test for proper operation of the device. An LED 139 indicates that contact arcing has occurred sometime in the last 24–48 hours. If the LED 139 is ON, it can be reset by pressing a reset switch 137; if the LED lights, indicating the arc has been detected again, the user is warned to locate and cure the arcing condition.

Figure 13A:
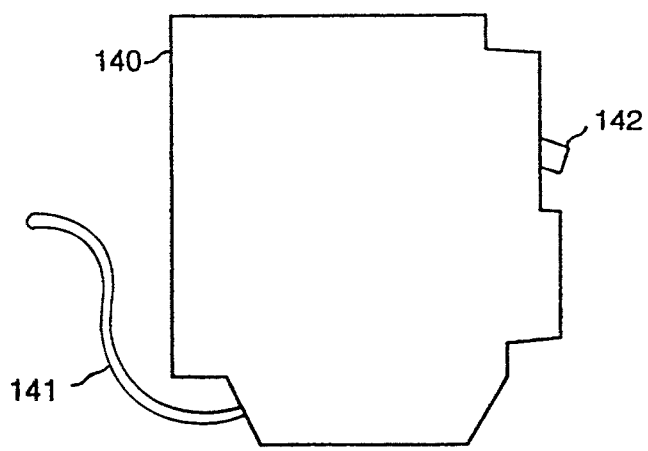
FIGS. 13(a) and 13(b) are front and side elevational views respectively of another physical package for the circuit of FIG. 9.
Figure 13B:
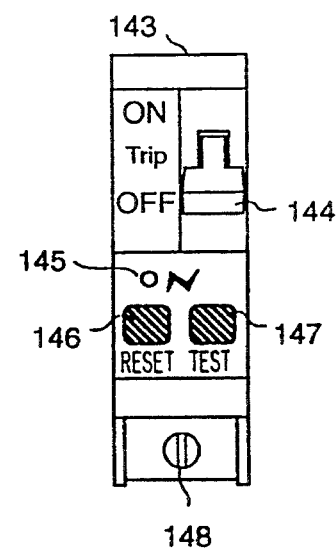

FIGS. 13(a) and (b) show side and front views, respectively, of another suitable packaging approach for housing the current-monitoring circuit of FIG. 9 in a conventional circuit breaker package. A molded plastic case 140 houses the entire assembly. The circuit breaker package accesses the High side of the line through an integral contact on the back of the package (not shown). As Neutral or Ground is also required for the circuit to operate, an additional wire 141 is provided for connection thereof. Screw terminal 148 provides High to the load. In this version, an internal interruption relay operates both as a standard current-operated circuit breaker and a voltage-actuated relay driven by the arc detector. The handle 142 can be manually actuated in the same manner as a conventional circuit breaker. A test switch 147 will manually trip the circuit breaker when pressed to test for proper operation of the device. An LED 145 indicates that contact arcing has occurred sometime in the last 24–48 hours. If the LED 145 is ON, it can be reset by pressing the Reset switch 146.

The Present Second Continuation-in-Part Application

As indicated above, this application is a continuation-in-part of Ser. No. 08/035,231, filed 22 Mar. 1993, which was itself a continuation-in-part of a prior application now issued as U.S. Pat. No. 5,223,795. In the parent application (essentially the entire specification of which is reproduced above) and the issued patent, emphasis was placed on detecting arcs by monitoring high-frequency noise on the current or voltage waveform for gaps synchronous to the waveform. That approach requires "substantially continuous" noise between the gaps—that is, there must be enough noise so that the gaps can be readily detected. This method works very well in preventing most fires, in that the chance of fire is small until an arc has developed that is substantially continuous. However, there are circumstances—e.g., explosive environments and the like—in which it would be highly desirable to be able to detect arcs which are intermittent, and in particular, which are not yet consistent enough to present the regular series of gaps detected by the parent application and the issued patent.

The capability of detecting intermittent arcs not exhibiting regular patterns of gaps in substantially continuous noise, while nonetheless distinguishing arcing from other sources of noise, is provided by the invention of the present second continuation-in-part application.

This new invention is based on further physical understanding of the process of arcing. Accordingly, a brief theoretical discussion precedes explanation of the subject matter of the present second continuation-in-part application.

As indicated above, when arcing occurs, the random motion of charged particles in the arc generates broad-band high-frequency noise. As discussed in the parent application and the issued U.S. Pat. No. 5,223,795, the arc will extinguish for a short period each time the voltage across the arc falls below the arc sustaining voltage and will reignite each time it again rises above the ignition voltage. This produces synchronous gaps in the high-frequency noise. If the arcing is substantially continuous, the resulting pattern of gaps is clear and can be used to discern arcing from other noise that might be present on the line. If, however, the arcing is intermittent and does not persist for substantial periods between the gaps, the pattern becomes less obvious and more difficult to discern. There are applications where it would be useful to be able to detect even this intermittent form of arcing and either provide an indication that arcing exists or interrupt the current to the arc. Therefore, the purpose of this second continuation-in-part application is to further explain the characteristics of high-frequency noise from electrical arcing and disclose additional methods of and apparatus for detecting such arcing.

Arcing occurs when the voltage across a gap filled with air or another ionizable material is sufficiently high to ionize a chain of atoms across the gap, causing electrons to flow across the gap. The physical initiation and extinction of electrical arcs occurs extremely rapidly. This is because the voltage breakdown mechanism that initiates the arc is actually a process of electron avalanche that occurs as the material (air, for example) between the electrodes is ionized, forming a conductive path. When even a single electron gains enough energy to bridge the gap between the electrodes, it will (probability=1) collide with an atom of the air, knock an electron out, and thereby ionize the atom. (Most of the ions produced in air are probably actually negative ions, i.e., an additional electron is accepted by the ionized atom. However, electron flow, rather than "hole flow," is described herein for ease of understanding.) At this point, there are two electrons, each of which will collide with atoms and ionize them. Then there will be four electrons, and so on. In effect, a single electron moving across the gap rapidly grows to a large number of electrons moving across the gap, the number of electrons increasing in an exponential fashion. This is referred to as electron "avalanche breakdown." The exponential increase in the number of electrons flowing, i.e., the current, produces a very fast rise in the current. The rise in the current can be detected and used to distinguish arcing.

The predominant characteristic of intermittent, low-voltage arcing is that it is, in general terms, an "all-or-nothing" process, i.e., it occurs in discrete, well-defined bursts. This is a result of positive hysteresis inherent in the arcing process, i.e., once an electron gets over the potential barrier, it forms a conductive path that in turn lowers the barrier. Thus, once initiated, the process is self-enhancing until thermal or other effects come into play and disrupt the flow of current.

Several points are worth mentioning before proceeding. First, the erratic jumps of electrons between individual atoms in the air is the mechanism that produces the broad spectrum of noise observed to be generated by arcing. Because the specific path length and direction of each individual electron are random, so are the electric and magnetic fields produced thereby. Consequently, the detected signal exhibits a wide bandwidth and a noisy frequency spectrum. Secondly, the process of electron avalanche breakdown may occur in a gas (e.g., air) or any other nonconducting or semiconducting material. In a semiconductor (including semiconductive oxide layers formed on switch contacts and the like), charge carriers can acquire enough energy to make electron-hole pairs by impact ionization.

Avalanche breakdown in semiconductors is a useful mechanism that has been widely applied. In fact, a common means of producing pulses having very fast rise times is to drive a semiconductor into a triggered-avalanche mode. Pulse rise times of tens of picoseconds or less can be readily achieved in this manner. Thyristors, including SCRs and TRIACs as commonly used in lamp dimmers, also work on this principle of avalanche multiplication. A low-energy trigger pulse is used to initiate avalanche-multiplication of the electron-hole pairs, very rapidly "turning on" the device.

In terms of arc detection, the fact that the rise in current at the initiation of the arc is inherently extremely rapid can be used by a detection mechanism to distinguish this current from other currents resulting from extraneous noise sources. The actual rise time will be a function of the various capacitances present across the junction. Since capacitance is proportional to the area of the conducting surfaces and inversely proportional to the separation, a gas is perhaps the least capacitive (least area, largest separation) and therefore fastest physical structure available.

Arc extinction also appears to be fast, although the mechanism is somewhat different. At the time of filing the present continuation-in-part application, it is the inventor's belief that arc extinction is actually the functional reverse of avalanche breakdown. At the end of the arc, just before it extinguishes, a path of ionized atoms exists. When the field drops to below the level that can support continued current flow (i.e., in the vicinity of the zero-crossings of the sinusoidal current waveform), these ions will absorb the electrons remaining in the conduction path and thereby rapidly extinguish the arc. It appears likely to the inventor that this process is somewhat slower than avalanche ignition—because a pre-existing arc will consist of a column of ionized atoms, such that it will take some time for all conductive paths to become electrically neutral—but no tests to determine whether this is the case have yet been carried out.

In the parent application and issued patent identified above, the inventor's recognition of the significance of the fast initiation and extinction of the arc current was apparent, in that the arc detectors disclosed and claimed therein detected arcs by identifying sharply-defined gaps in the high frequency noise due to arcing occurring at each zero-crossing of the waveform. However, it now appears to the inventor that the abrupt change in current at the start and/or end of each burst of arcing is itself enough to reliably identify the noise as having originated from an arc. To thus identify arcs would be advantageous: detection of gaps synchronous to the waveform requires that some minimum amount of noise present, such that a chance of fire would be present. Detection of intermittent arcing responsive to analysis of a minimum-noise avalanche effect would greatly reduce this possibility, would increase the detection sensitivity of the instrument, and would be practicable, assuming no other noise source were encountered capable of generating such rapid changes in the line current.

Initial testing (see below) indicates that lamp dimmers, the most commonly found source of fast rise time noise, produce impulses with a rise time of about 1 $\mu$s. Since lamp dimmers themselves employ avalanche-mode devices as above, it is either the internal capacitance of the device or an external snubber that slows down the change in current. An in-line spark on a 150 watt light bulb, on the other hand, produces an initial rise time of less than 5 ns (5 ns being the minimum response time of the instrumentation used for these tests) each time the arc re-ignites. Thus, it is likely that this difference in noise current rise time—nearly three orders of magnitude—can be used to differentiate arc noise from other extraneous noise.

Figure 14:
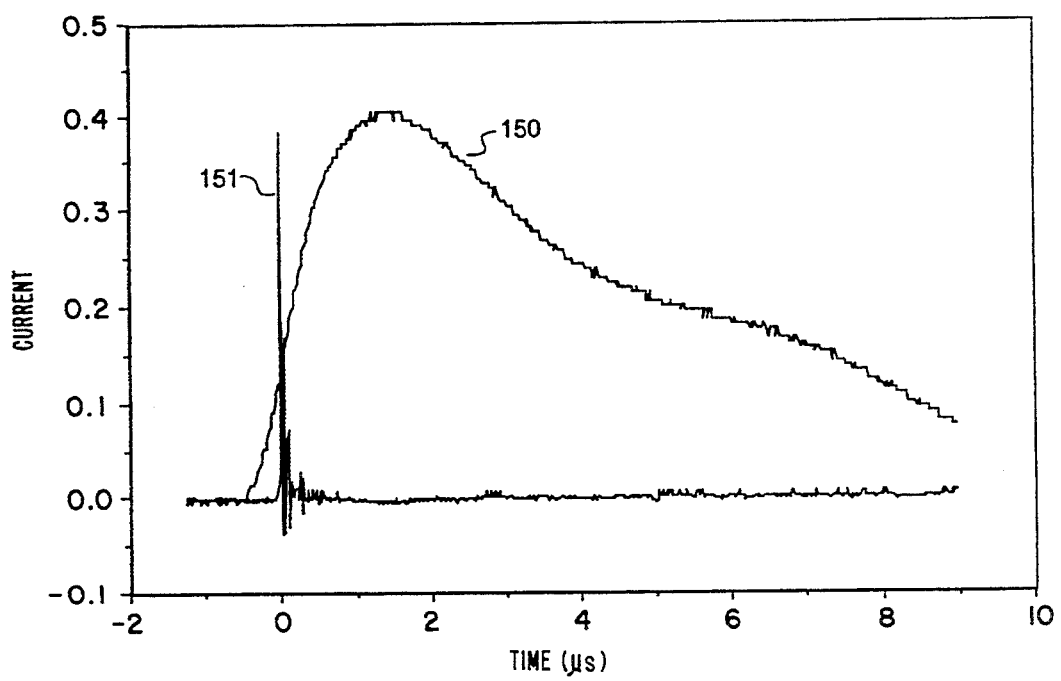
FIG. 14 shows a graph of current versus time comparing the noise bursts due to contact arcing with the noise due to the turning on of a semiconductor switching device employing electron avalanche control techniques.

Tests performed prior to filing this application consisted of measuring the high-frequency current on the high side of the line feeding one of two loads, a 150 watt halogen floor lamp with an internal dimmer or a standard 150 watt light bulb through a carbon spark gap. The length of the cords between the measurement and the load was about 10 feet in both cases. FIG. 14 shows the result. In FIG. 14, trace 150 is the impulse noise from the lamp dimmer, and trace 151 is the high-frequency noise produced by the arc in series with the 150 watt light bulb.

It will be apparent from FIG. 14 that an initial pulse is present at the beginning of the noise burst exhibited by trace that is much higher in amplitude than the noise itself. The initial rise time of the arc noise was measured to be 10 ns, indicating frequency components on the order of 100 MHz. The rise time of the dimmer impulse, on the other hand, is about 1 $\mu$s indicating frequency components no higher than about 1 MHz. Clearly, if burst rise times or frequencies in these ranges can be monitored (and if there are no noise sources commonly found which emit such bursts), this characteristic can be used to distinguish arcing from such other sources of noise.

Figure 15:
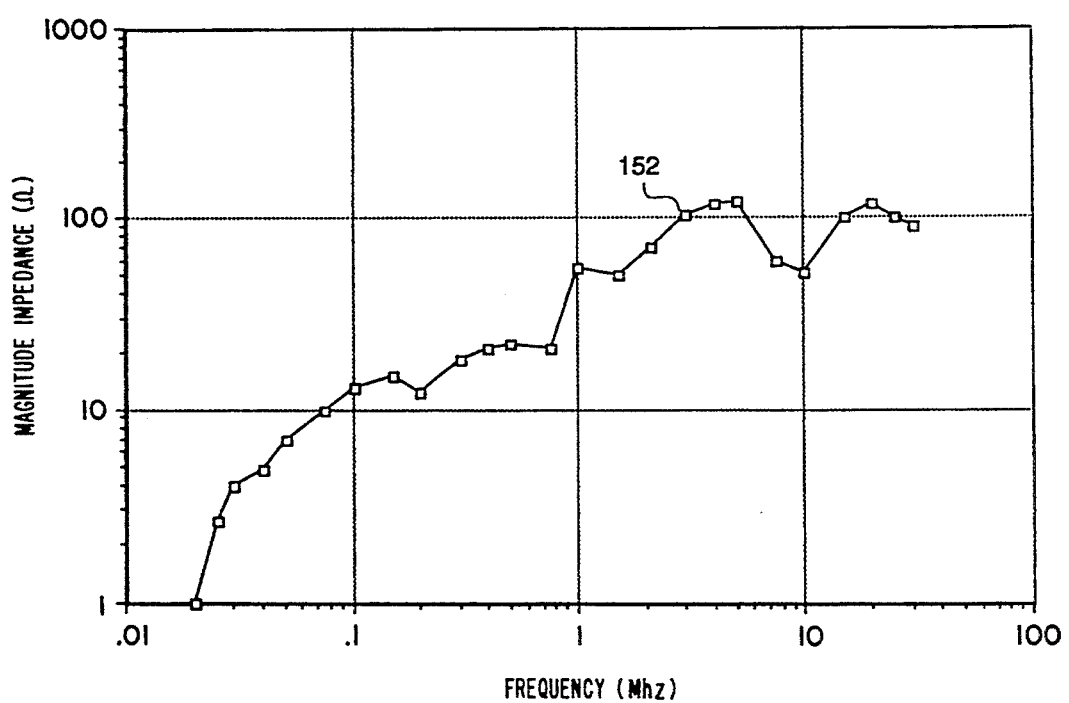
FIG. 15 reproduces published results describing the impedance of a typical household power line as a function of frequency.

The present inventor has found no reference reporting the RF impedance of conventional household power lines providing results above 30 MHz. However, the results of measurements reported in J. R. Nicholson et al, "RF Impedance of Power Lines and Line Impedance Stabilization Networks in Conducted Interference Measurements", IEEE Transactions on Electromagnetic Compatibility (May 1973) and reproduced in FIG. 15, show that the maximum average impedance, approximately 100$\Omega$, occurs at 1 MHz and above, and remains approximately constant at least up to 30 MHz. This impedance of approximately 100$\Omega$ at high frequencies is more than sufficient for good transmission. Accordingly, it is feasible to monitor arcing in household power lines by examining the noise for frequency components in excess of 10 MHz, and possibly up to and above 100 MHz. While standing wave effects become substantial at frequencies much above 10 MHz, the effect being unpredictable cancellation and reinforcement of particular frequencies, i.e., of coherent signals, the bandwidth of the noise due to arcing is broad and therefore the total response of the detector of the invention will be little affected.

In the parent application and issued U.S. Pat. No. 5,223,795 referred to above, bandwidth of arc noise is recognized as a key element of the detection methods. The present improvement, however, recognizes further that intermittent arcing will always occur in well-defined bursts and that the initial rate of change of the current, that is, the burst rise time, will be extremely high, producing frequency components at 10 MHz and above.

A second inherent characteristic of intermittent arc-generated noise is that, as the arcing becomes more and more persistent, the bursts of noise produced will tend to be nonuniform in duration and spacing until the arcing becomes substantially continuous, i.e., until the bursts fill the temporal interval between the gaps always present at the zero-crossings of the current waveform. Nonuniformity of the bursts is particularly the case with intermittent arcing on relatively low-voltage systems, e.g., 120 volt residential systems. The reason is generally as follows.

Arcing will occur between any pair of opposed conductors—e.g., between a worn plug contact and the corresponding contact on the receptacle—when the electric field strength is high enough to allow electrons to escape the thermionic barrier of the contact material. In a low-voltage system, e.g., 120 volts, the necessary field strength can only occur if the gap is small, on the order of a few thousandths of an inch or less. Because of minute surface irregularities at the contact junction, the first arc will occur at that asperity that is closest to the other contact, i.e., where the field strength is the highest. The instant an arc jumps this gap, the field strength across the surface of the contacts drops dramatically due to the low initial resistance of the arc. The resulting field strength is not sufficient to initiate an arc at another site and consequently the majority of the current will attempt to flow along the path of the first site. The extreme current constriction at this point rapidly melts the metal and either causes a stable metallic bridge to form, thereby establishing contact, or causes the site to "explode", thereby breaking the connection.

If a connection is made having a conductive area sufficient to handle the current flow, arcing ceases. If the connection breaks, the field strength immediately rises again and another arc forms at a new location on the contact surface. This opportunistic arc site meandering is highly chaotic and occurs very rapidly. Only when a stable bridge is formed or when a new site is no longer available does the arcing event cease. Thus, the duration of the entire arcing event is dependent on extremely rapid, random physical changes occurring at the contact interfaces, and therefore itself tends to be random.

A third characteristic of intermittent arc-generated noise is that the bursts of noise will generally not be synchronous to the line frequency, i.e., they will occur at nonuniform intervals. While there may be some tendency for an arc to re-ignite in the same vicinity on the voltage waveform as it did the previous cycle, e.g., at the peak, again the microscopic processes at the contact junction are so energetic and locally destructive that the precise point of re-ignition will vary considerably from cycle to cycle. This is a particularly useful quality in terms of discriminating arc noise from extraneous noise because other sources of impulse noise, e.g., dimmers, are necessarily synchronous to the line frequency.

The fourth and final characteristic of intermittent arc-generated noise is that arc bursts will not occur in the immediate vicinity of the current zero-crossings, i.e., the gaps as described in the parent application and issued U.S. Pat. No. 5,223,795 referred to above will always be present.

Accordingly, the preferred method of detecting intermittent contact arcing according to the present continuation-in-part application consists of determining if the noise exhibits one or more of the following quantifiable characteristics:

1. The noise occurs in sharply defined bursts.
2. The rate of change of the current is above a predetermined level.
3. Significant high-frequency components (e.g., >10 MHz) are present.
4. The width of successive noise bursts exhibits nonuniformity.
5. The intervals between successive bursts exhibit nonuniformity.

Furthermore, possible arcing events can be disqualified if they are determined to take place in the "gaps", i.e., in the vicinity of the zero-crossings of the current waveform.

In the preferred embodiment of the present invention, a microprocessor is used to qualify these features and determine if intermittent arcing is present. The circuit is essentially identical to that described in the parent application, e.g., as shown in FIG. 9. The microprocessor can simultaneously or alternatingly carry out the methods for detecting substantially continuous arcing disclosed and claimed in the parent application and issued U.S. Pat. No. 5,223,795.

The determinations of whether the noise occurs in sharply defined bursts, whether the rate of change of the current exceeds a predetermined level, or whether significant high frequency components are present—that is, testing for characteristics 1-3 above—can each be made based on the rate of change of the current; that is, these characteristics are substantially equivalent.

To measure the rate of change of current, the current sensing transformer can be made to respond to the derivative of the current by simply not loading its secondary winding.

Current transformers operate by magnetically coupling the power line conductor to be monitored to a secondary coil driving a load resistor, R. A time-varying current $I_p$ flowing in the power line conductor produces a flux $\phi$ through the coil, and this flux in turn induces a voltage across it. The resulting current in the load resistor, $I_L$, is governed by the following differential equation.

$$\frac{1}{R} \frac{d\Phi}{dt} = \frac{L}{R} \frac{dI_L}{dt} + I_L$$

In a standard current transformer, the load resistor R is kept small, so that:

$$\frac{L}{R} \frac{dI_L}{dt} >> I$$

When this is the case, the current through the load resistor will be approximately proportional to the flux and therefore the primary current:

$$I_L = \frac{\Phi}{L} = I_p$$

If, however, the load resistor R is made large, then:

$$\frac{L}{R} \frac{dI_L}{dt} << I$$

and the current through the load resistor will now be approximately proportional to the rate of change of the flux and therefore the rate of change of the primary current:

$$I_L \approx \frac{1}{R} \frac{d\Phi}{dt} \propto \frac{dI_p}{dt}$$

Thus, by simply operating the current transformer with a high load resistance, the output can be made to respond to the derivative of the primary current. A current transformer used in this manner is often referred to as a Rogowski coil (see Pellinen et al, "Rogowski coil for measuring fast, high-level pulsed currents", *Rev. Sci. Inst.* 51(11), November 1980), and has found wide application for measuring currents in high-current, particle physics. The Rogowski coil uses an air core to prevent saturation but the equations apply to any core material.

When the derivative of the current has thus been determined, the microprocessor can compare the derivative of the current to a predetermined level and provide a signal that arcing may possibly be present when that derivative exceeds the predetermined level.

The signal that an arcing event may possibly have been detected is then preferably processed according to one or more further tests to distinguish the possible arcing event from other sources of bursts of high-frequency noise which may exist on the line. Several different tests may be performed. For example, as indicated above, intermittent arcing exhibits a characteristic of nonuniformity in that the bursts are irregular in length, are spaced irregularly, and are not synchronous to the power waveform; at the same time, intermittent arcing can only take place when the electric field available is sufficient to cause ionization to take place as described above. Therefore if a high-frequency noise burst is detected in the vicinity of the zero-crossing of the current waveform, it can be determined that an arcing event was not, in fact, detected.

Accordingly, measurements of the width of successive noise bursts and the intervals between successive bursts (or both) may be used to provide further discrimination, that is, to further determine whether the bursts are in fact due to intermittent arcing on the power line. Sources of high frequency noise generated by lamp dimmers and the like will necessarily be synchronous to the line frequency, so that if bursts of noise are detected that are not synchronized to the line frequency, this may be taken as an indication that arcing has occurred. However, in the presently preferred embodiment these tests are employed only after the bursts of high-frequency noise have already been determined to exhibit a very fast rate of change of the current, which would in any case disqualify high-frequency noise due to lamp dimmers (so far as now known), as discussed above.

The timing of the bursts can also be compared to the zero-crossings of the current waveform, in order that high-frequency noise bursts in the near vicinity of zero-crossings of the current waveform can be determined to be due to some cause other than arcing, again for reasons discussed above.

It should be realized that, although the method of detection of intermittent arcing of the invention is also capable of detecting continuous arcing as disclosed in the parent application and issued patent referred to above, the present invention may also be provided in a practical device employing both methods.

The methods of detecting arcing by detecting rapid rates of change of current provided by the present invention may also be employed as the control element of a circuit breaker that responds instantly to the initial spark produced during a "hard" short, i.e., a short produced by a low resistance connection being placed directly across the power line. In this case, an intense arc may occur at the instant of contact but extinguish as the connection is made. If the initial arc is energetic enough, molten metal may be expelled from the connection thereby causing a fire hazard. Since the duration of the arc may be much shorter than a line frequency cycle, detection cannot be done using gap analysis methods. However, the initial rate of change of the current will be extremely high due to the low source impedance; this fact can be used to indicate the presence of the short, and to accelerate the tripping of the breaker.

Figure 16A:
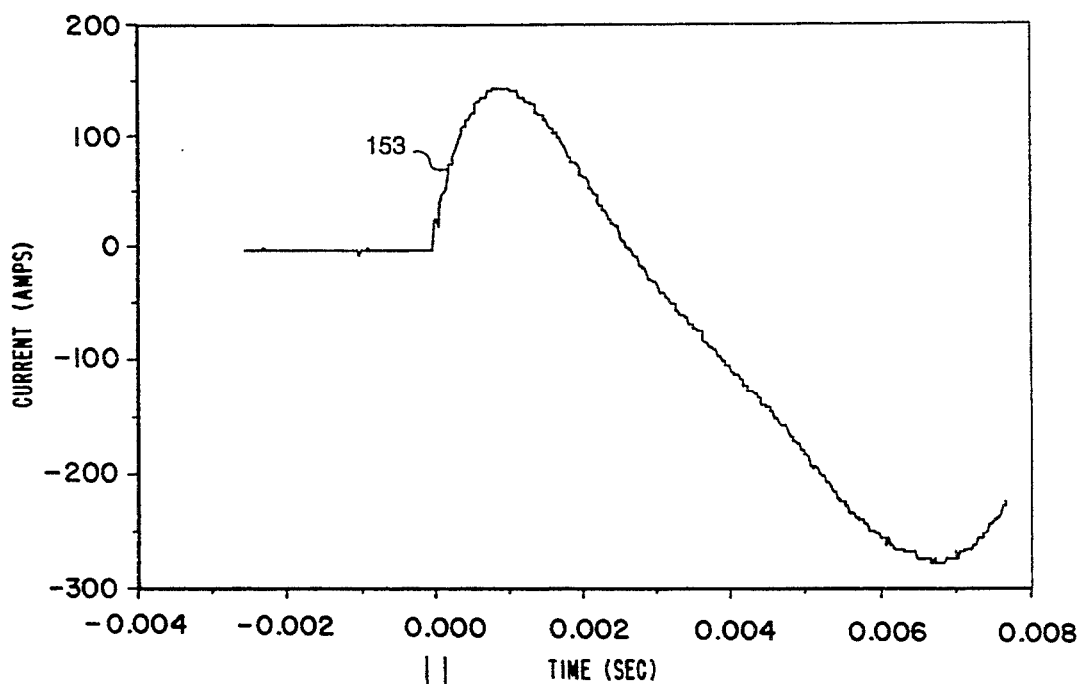
FIG. 16(a) shows the line current responsive to a direct short as a function of time.
Figure 16B:
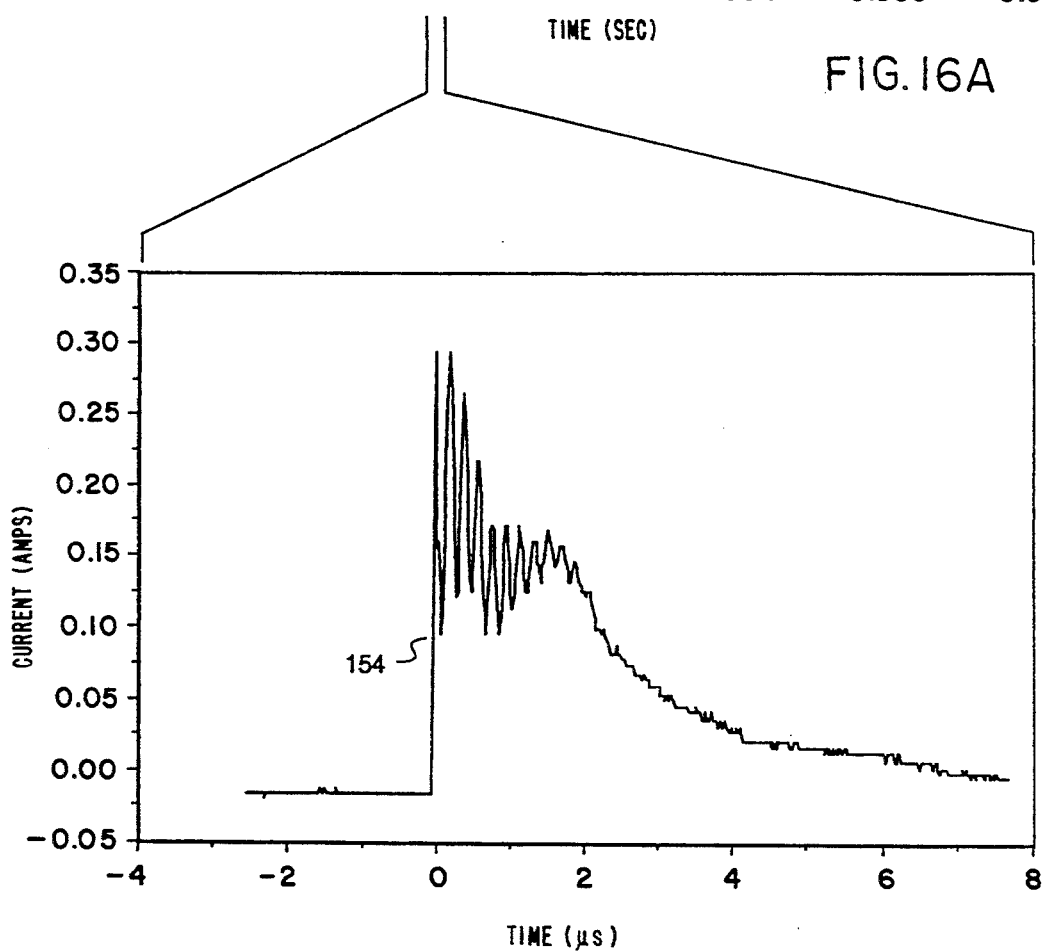
FIG. 16(b) shows the line current responsive to a direct short, as in FIG. 16(a), but at a much expanded time scale.

FIG. 16(a) shows a line frequency view of the current 153 produced by a direct short across a 120 volt residential power line together with an expanded view (FIG. 16(b)) of the initial high-frequency current pulse produced by the arc. The initial rise time of the current 154 is on the order of 10 ns or less. It should be noted that the bandwidth of the current sensor used falls off above 10 MHz, and that the transformer probably saturates at about 10 A, as can be seen by its attenuated response, and therefore the actual rise time may be much higher.

It should be understood that while a distinction is made herein between line fault arcing and contact arcing for purposes of clarity, the arc detector of the present invention may be applicable to detection of arcs due to both conditions. For example, when a relatively high-resistance line fault occurs, it may exhibit substantially the same characteristics as described for contact faults.

It should also be understood that while this invention specifically addresses prevention of electrical fires in households, offices and the like, the same methods are generally applicable to a wide range of applications where it is desirable to detect the presence of contact arcing. For example, it may be desirable to monitor long utility power distribution lines continuously for arcing due to breaks or high-resistance shorts and, if detected, provide an alarm or interrupt current to the line. Another useful application would be to monitor the windings of large electric motors or generators for the presence of arcing. The present invention is applicable to the detection of arcing in any alternating-current power system.

Furthermore, while the current document makes reference to 115 V, 60 Hz mains power as standard in North America, the present invention will work at any line voltage or frequency.

Finally, it will be appreciated that although the preferred embodiments of this invention discussed in detail herein each use a microprocessor to analyze high-frequency noise patterns to determine whether arcing exists, the same basic detection methods can be implemented in a variety of different ways, including analog circuitry without a microprocessor, circuitry using a digital signal processor, or in other ways.

Inasmuch as the present invention is subject to many variations, modification and changes in detail, it is intended that all subject matter discussed above or shown in the accompanying drawings be interpreted as illustrative only and not be taken in a limiting sense.

What is claimed is:

1. In an electrical network having AC power supply lines, such that any electrical contact arcing in the network superimposes sharply-defined bursts of wide bandwidth high-frequency noise on the power supply lines, a method for determining that such bursts of high-frequency noise are produced by electrical contact arcing as opposed to an external disturbance, said method comprising the steps of:

monitoring the high-frequency components on the power line waveform to detect bursts of wide bandwidth high-frequency noise having detectable characteristics that differ from other typical electrical disturbances;

said detectable characteristics including one or more of current rise times at the ends of said bursts being less than a predefined value, the rate of change of the current waveform exceeding a predetermined minimum level during said bursts, and the frequency content of said bursts including components of frequency greater than 10 MHz; and determining that arcing exists on the power line when a plurality of the detected bursts satisfy a predetermined algorithm for examining the pattern of detected bursts as a function of time.

2. The method of claim 1, wherein said bursts are detected by measuring the rate of change of the current waveform, and by determining that a burst of high-frequency noise has been detected when said rate of change of the current waveform exceeds a predetermined minimum level.

3. The method of claim 1, wherein said predetermined algorithm evaluates the nonuniformity of one or more of the spacing, the length, and the frequency content of said bursts.

4. The method of claim 3, wherein the frequency content of said bursts is evaluated to determine one or more of the rise time, fall time, bandwidth, or mean frequency of the bursts.

5. The method of claim 3, wherein said predetermined algorithm further requires that said bursts not be detected during intervals substantially coincident with zero-crossings of the current waveform.

6. A method for detecting the presence of electrical arcing on an AC power line of frequency F and period T=1/F, comprising the following steps:

monitoring the line voltage, the load current, or energy radiated from the power line, as a waveform;

examining the monitored waveform for detecting the presence of high-frequency noise, said high-frequency noise being substantially higher in frequency than F; and monitoring the detected noise present on the waveform for the occurrence of one or more predefined features in the noise characteristic of arcing, said features including discrete bursts of wide bandwidth high-frequency noise; and determining that arcing exists if said features occur only at substantially nonuniform intervals.

7. The method of claim 6, comprising the further step of determining whether said features are nonuniform with respect to one or more of their spacing, timing, and frequency content.

8. The method of claim 6, wherein a feature is determined to have occurred upon detection of at least one burst of high-frequency noise including frequency components of at least 10 MHz.

9. The method of claim 6, wherein a feature is determined to have occurred upon detection of at least one burst of high-frequency noise having a rise time on the order of 10 ns.

10. The method of claim 6, comprising the further step of measuring the spacing of successive bursts to determine whether they are detected only outside temporal gaps spaced by integral multiples of T/2.

11. The method of claim 6, comprising the further steps of:

monitoring zero-crossings of the line voltage or current;

determining the temporal position of the feature relative to said zero-crossings;

determining by said position the reactance of the load in series with the arc; and providing an additional output indicating the reactance of the load.

12. The method of claim 6, wherein the range of high-frequency noise monitored extends from about 10 MHz to about 100 MHz.

13. Apparatus for detecting the presence of electrical arcing on an AC power line of frequency F and period T=1/F, comprising:

means for monitoring one of the line voltage and the load current and for extracting high-frequency noise therefrom, said high-frequency noise being substantially higher in frequency than F;

means for monitoring the extracted noise for detecting the occurrence of one or more bursts in the noise, said bursts having detectable properties characteristic of arcing, said detectable properties including one or more of rapid current rise time, frequency components in excess of 10 MHz, and broad frequency bandwidth;

means for determining that arcing exists if said detected bursts, and/or a sequence of said bursts, satisfy one or more additional predetermined conditions; and means activated to produce an output signal responsive to the determination that arcing exists.

14. The apparatus of claim 13, wherein said bursts are determined to have been detected only when a minimum quantity of high-frequency noise of frequency above on the order of 10 MHz is detected.

15. The apparatus of claim 13, wherein said means for determining that arcing exists if said bursts, and/or a sequence of said bursts, satisfy one or more additional predetermined conditions requires that said bursts be detected only outside intervals on the current waveform spaced by integral multiples of T/2.

16. The apparatus of claim 13, wherein said means for monitoring the noise for detecting the occurrence of one or more bursts in the noise comprises means for determining whether said high-frequency noise exhibits one or more bursts having a rise time at least an order of magnitude shorter than the rise time of pulses of noise emitted by any other source of high-frequency noise on the power line.

17. The apparatus of claim 13, further comprising means for determining whether plural said bursts are detected, and means responsive thereto for further determining whether said bursts are substantially nonuniform with respect to one of more of their spacing, timing, and frequency content.

18. The apparatus of claim 13, further comprising:

means for monitoring zero-crossings of the line voltage or current;

means for determining the temporal position of the feature relative to said zero-crossings;

means for determining by said position the reactance of the load in series with the arc; and means for providing an additional output indicating the reactance of the load.

19. The apparatus of claim 13, wherein said means for determining that arcing exists is a microprocessor.

20. The apparatus of claim 13, further comprising an annunciator responsive to said output signal for providing one or both of audible or visible alarm signals.

21. The apparatus of claim 13, further comprising means responsive to said means for determining that arcing exists for interrupting the current to the load.

22. A method for detecting the presence of electrical arcing on a power line powered by an AC source, comprising the following steps:

monitoring the line voltage, the line current, or energy radiated from the power line, as a waveform;

examining the waveform for detecting the presence of discrete, well-defined bursts of wide bandwidth noise including frequency components above 10 MHz;

monitoring the time of detection of said bursts with respect to the zero-crossings of the current waveform; and determining that arcing exists on the power line when a plurality of the detected bursts are detected other than during portions of the waveform surrounding the zero-crossings of the current waveform.

23. The method of claim 22, comprising the further step of evaluating the degree of nonuniformity of one or more of the spacing, the length, and the frequency content of said bursts.

24. The method of claim 22, comprising the further step of evaluating the frequency content of said bursts to determine one or more of the rise time, bandwidth, or mean frequency of noise in the detected bursts.

* * * * *